US012614588B2

(12) United States Patent
Kim et al.

(10) Patent No.: US 12,614,588 B2
(45) Date of Patent: Apr. 28, 2026

(54) OPTICAL PROPERTY STORAGE DEVICE AND SYSTEM USING SAME

(71) Applicant: KOOKMIN UNIVERSITY INDUSTRY ACADEMY COOPERATION FOUNDATION, Seoul (KR)

(72) Inventors: Dae Hwan Kim, Seoul (KR); Dong Myoung Kim, Seoul (KR); Sung Jin Choi, Seoul (KR); Chang Wook Kim, Seoul (KR); Jin Gyu Park, Goyang-si (KR); Dong Uk Kim, Suwon-si (KR); Hyun Kyu Lee, Suwon-si (KR); Tae Jun Yang, Suwon-si (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 205 days.

(21) Appl. No.: 18/564,258

(22) PCT Filed: Apr. 7, 2022

(86) PCT No.: PCT/KR2022/005029
§ 371 (c)(1),
(2) Date: Nov. 27, 2023

(87) PCT Pub. No.: WO2022/250283
PCT Pub. Date: Dec. 1, 2022

(65) Prior Publication Data
US 2024/0379156 A1 Nov. 14, 2024

(30) Foreign Application Priority Data
May 28, 2021 (KR) ........................ 10-2021-0069283

(51) Int. Cl.
*G11C 13/00* (2006.01)
*G06N 3/063* (2023.01)
(Continued)

(52) U.S. Cl.
CPC ........... *G11C 13/003* (2013.01); *G06N 3/063* (2013.01); *G06N 3/0675* (2013.01);
(Continued)

(58) Field of Classification Search
CPC . G11C 13/003; G11C 13/0007; G11C 13/004; G11C 13/0061; G11C 13/0069;
(Continued)

(56) References Cited

U.S. PATENT DOCUMENTS 6,683,645 B1 * 1/2004 Collins ................. H10F 39/802
348/E5.081
10,305,037 B2 5/2019 Jung
(Continued)

FOREIGN PATENT DOCUMENTS

KR 1020140046809 A 4/2014
KR 1020170069893 A 6/2017
KR 1020190118174 A 10/2019

OTHER PUBLICATIONS

Extended European Search Report for corresponding Euoropean Patent Application No. 22811476.5 dated Apr. 15, 2025 (12 Pages).
(Continued)

*Primary Examiner* — Jerome LeBoeuf
(74) *Attorney, Agent, or Firm* — Harness, Dickey & Pierce, P.L.C.

(57) ABSTRACT

A device according to an exemplary embodiment of the present invention includes a light transistor in which the conductance between a source electrode and a drain electrode changes in accordance with optical properties of color temperature and illumination of incident light; and a variable
(Continued)

CT / lux tunable LED resistance memory device of a second terminal in which a first electrode is electrically connected to any one electrode from among the source and drain electrodes of the light transistor, and which stores a conductance changing in accordance with the changed conductance of the light transistor.

18 Claims, 30 Drawing Sheets

(51) Int. Cl.

| | |
|---|---|
| *G06N 3/067* | (2006.01) |
| *G11C 13/04* | (2006.01) |
| *H10B 63/00* | (2023.01) |
| *H10N 70/00* | (2023.01) |
| *H10N 70/20* | (2023.01) |

(52) U.S. Cl.
CPC ........ *G11C 13/0007* (2013.01); *G11C 13/004* (2013.01); *G11C 13/0061* (2013.01); *G11C 13/0069* (2013.01); *G11C 13/047* (2013.01); *H10B 63/30* (2023.02); *H10N 70/257* (2023.02); *H10N 70/841* (2023.02)

(58) Field of Classification Search
CPC .......... G11C 13/047; G11C 2013/0073; G11C 2013/0092; G11C 2213/79; G11C 13/0002; G11C 11/54; G11C 13/041; G11C 13/0004; G06N 3/063; G06N 3/0675; H10B 63/30; H10N 70/257; H10N 70/841; H10F 55/165
See application file for complete search history.

(56) References Cited

U.S. PATENT DOCUMENTS

| | | | | |
|---|---|---|---|---|
| 11,164,988 | B2 | 11/2021 | Adinolfi et al. | |
| 11,170,852 | B1 * | 11/2021 | Kinney | G11C 11/1675 |
| 2015/0325789 | A1 | 11/2015 | Park et al. | |
| 2016/0336064 | A1 | 11/2016 | Seo et al. | |
| 2019/0181292 | A1 | 6/2019 | Song et al. | |
| 2020/0116931 | A1 * | 4/2020 | Sharma | G02B 6/12004 |

OTHER PUBLICATIONS

Vasileiadis Nikolaos et al: "A New 1P1R 1,12,13 INV. Image Sensor with In-Memory Computing G11C13/04 Properties Based on Silicon Nitride G11C13/00 Devices", H10F30/21 2019 IEEE International Symposium on G11C11/54 Circuits and Systems (ISCAS), IEEE, G06N3/067 May 22, 2021 (May 22, 2021), pp. 1-5, G06N3/063 XP033933173, ISSN: 2158-1525, DOI: 10.1109/ISCAS51556.2021.9401586 ISBN: 978-1-7281-3320-1 [retrieved on Apr. 12, 2021] Y * p. 2, left-hand column, paragraph 4-2-11, p. 4, right-hand column, paragraph 1.

Cho Sung Woon et al: "Recent Progress in 18 Transistor-Based Optoelectronic Synapses: From Neuromorphic Computing to Artificial Sensory System", Advanced Intelligent Systems, vol. 3, No. 6, Feb. 5, 2021 (Feb. 5, 2021), pp. 1-20, H10F XP093088378, DE ISSN: 2640-4567, DOI: 10.1002/aisy.202000162 Y * p. 1, left-hand column, paragraph 1-19,20 p. 5, left-hand column, paragraph 1 * * p. 12, right-hand column, last paragraph—p. 15, left-hand column, paragraph 2.

Pedretti G. et al: "Memristive neural 2-11,20 network for on-line learning and tracking with brain-inspired spike timing dependent plasticity", Scientific Reports, vol. 7, No. 1, Jul. 13, 2017 (Jul. 13, 2017), pp. 1-10, XP093024114, DOI: 10.1038/s41598-017-05480-0 * p. 2, paragraph 3-paragraph 4; figure 1.

Choi Sungju et al: "Implementing an 14-17,20 artificial synapse and neuron using a Si nanowire ion-sensitive field-effect transistor and indium-gallium-zinc-oxide memristors", Sensors and Actuators B: Chemical, Elsevier BV, NL, vol. 296, Jun. 8, 2019 (Jun. 8, 2019), pp. 1-9, XP085739738, ISSN: 0925-4005, DOI: 10.1016/J.SNB.2019.05.093 [retrieved on Jun. 8, 2019] * p. 2, left-hand column, paragraph 3—p. 5, right-hand column, last paragraph; figures 1-5.

Kim Donguk et al: "Pd/IGZO/p + -Si 14-17,20 Synaptic Device with Self-Graded Oxygen Concentrations for Highly Linear Weight Adjustability and Improved Energy Efficiency", ACS Applied Electronic Materials, vol. 2, No. 8, Aug. 25, 2020 (Aug. 25, 2020) , pp. 2390-2397, XP093135813, ISSN: 2637-6113, DOI: 10.1021/acsaelm.0c00341 * p. 2393, left-hand column, last paragraph—p. 2394, right-hand column, paragraph 2; figures 4,5.

Li Yesheng et al: "Hardware 14-17,20 Implementation of Neuromorphic Computing Using Large-Scale Memristor Crossbar Arrays", Advanced Intelligent Systems, vol. 3, No. 1, Nov. 4, 2020 (Nov. 4, 2020), pp. 1-26, XP093063187, DE ISSN: 2640-4567, DOI: 10.1002/aisy.202000137 * p. 2, left-hand column, last paragraph—p. 7, left-hand column, paragraph 2.

International Search Report (English and Korean) and Written Opinion of the ISA (Korean) issued in PCT/KR2022/005029, mailed Aug. 3, 2022; ISA/KR.

* cited by examiner

FIG. 1    <u>10</u>

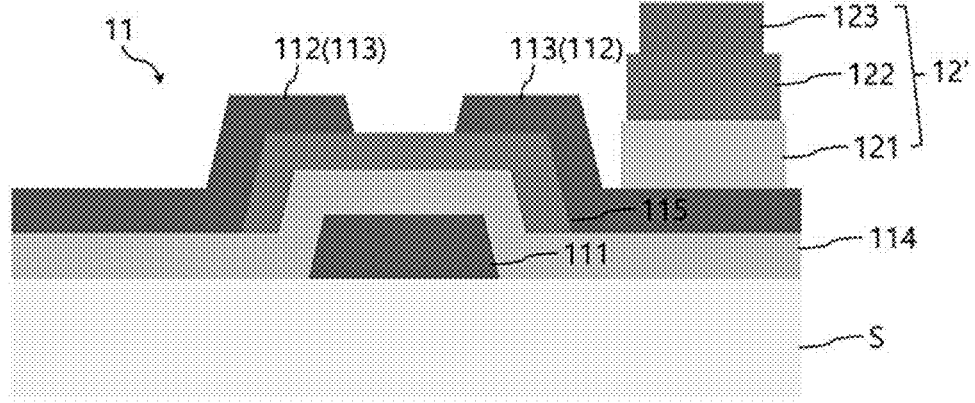
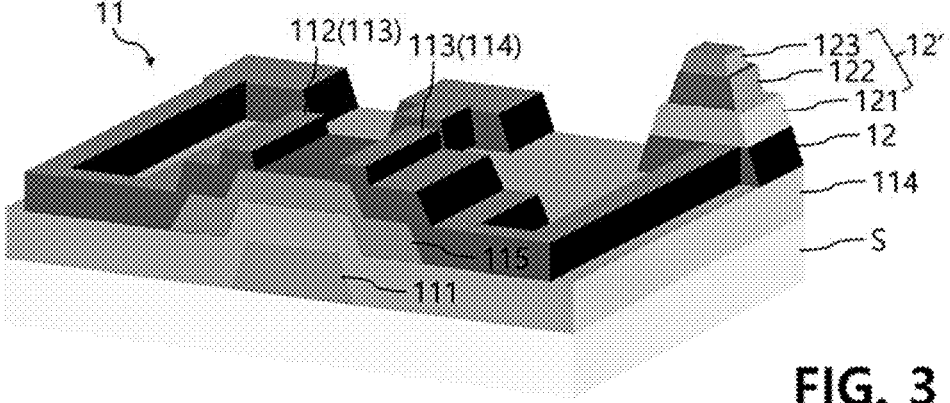
FIG. 3

(a)
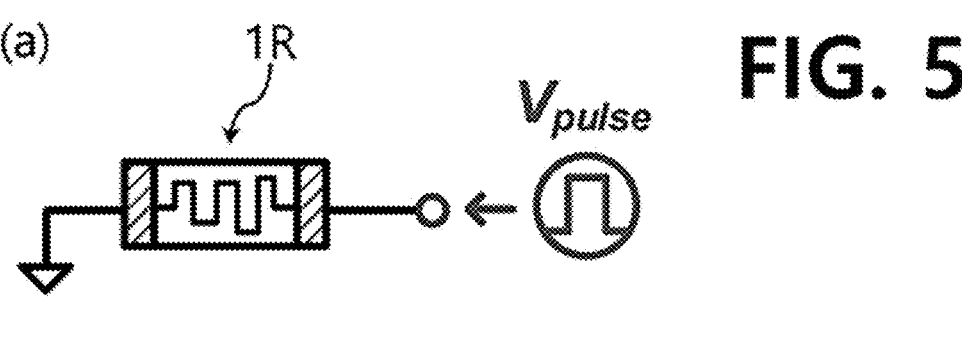
FIG. 5
(b)
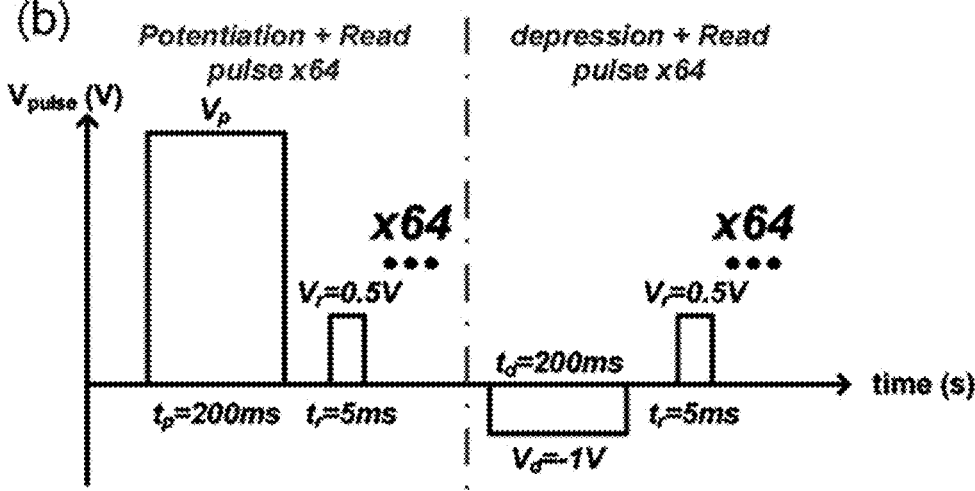
(c)
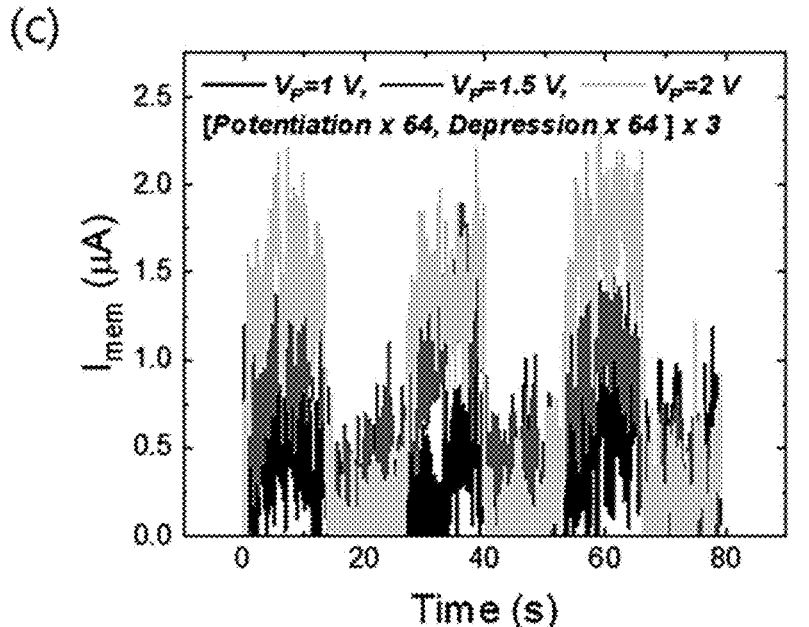

(a)
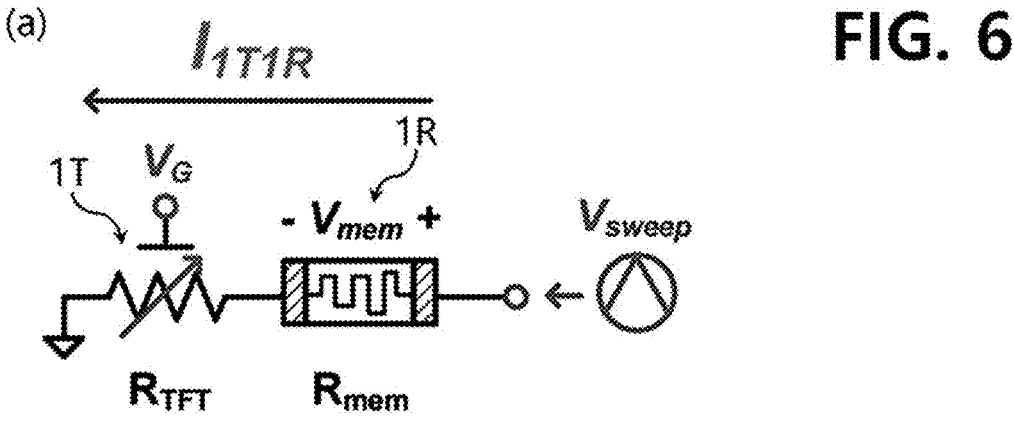
FIG. 6
$R_{TFT}$ modulated by $V_G$
(b)
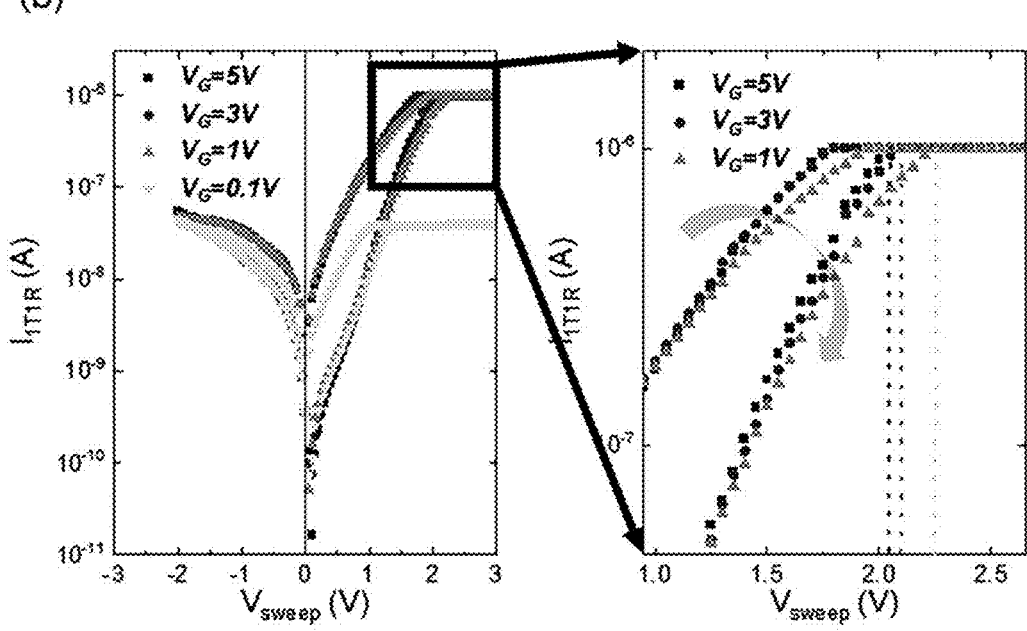

(a)
FIG. 7
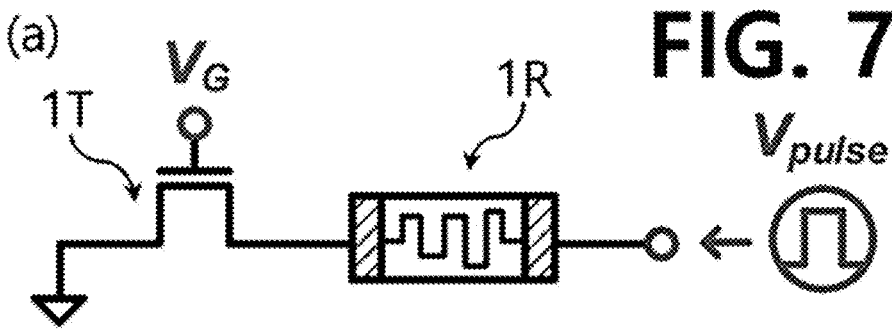
1T + 1R (memristor)
(b)
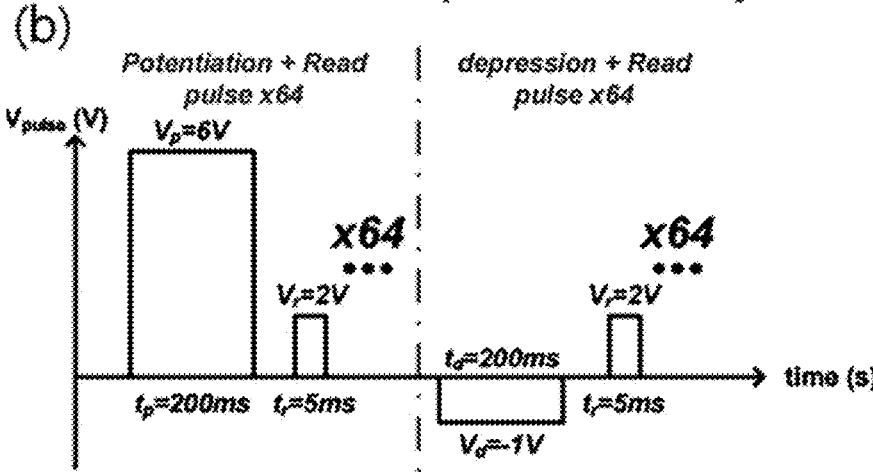
(c)
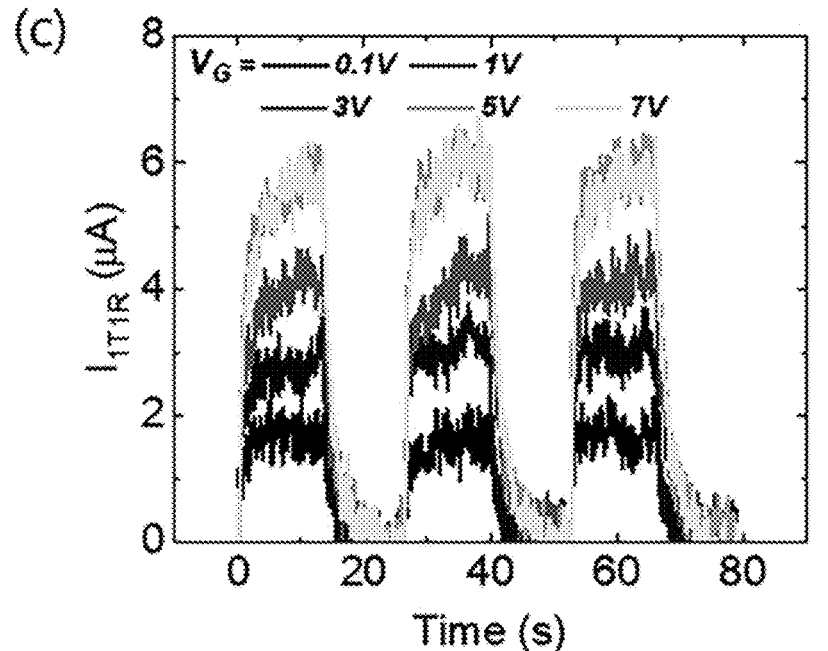

(a)
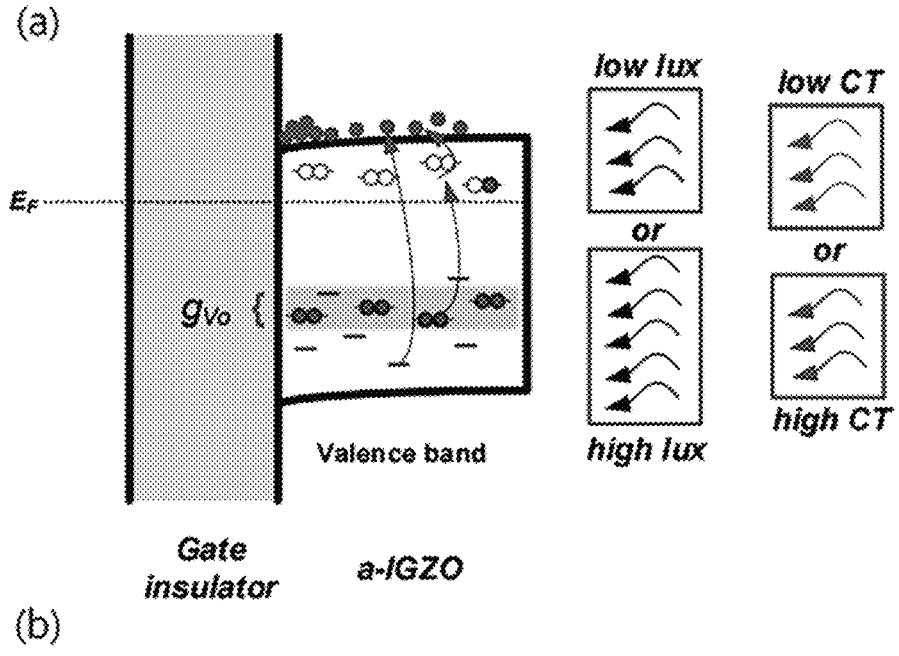
(b)
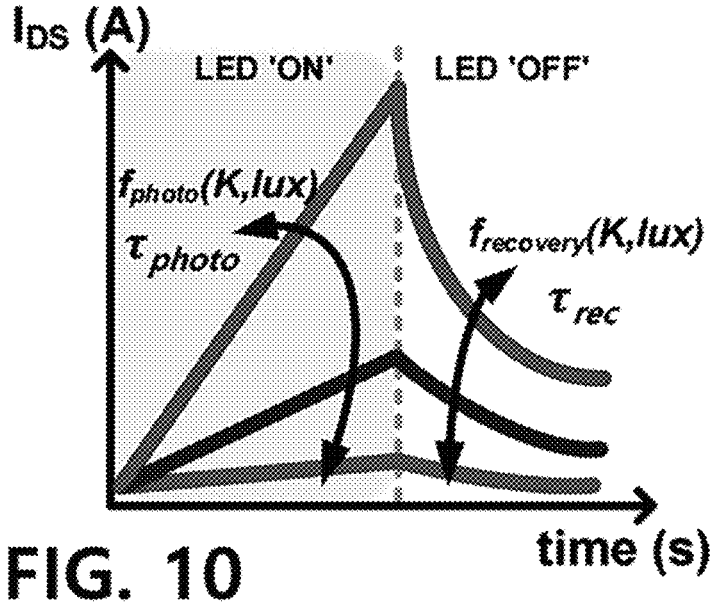
FIG. 10

(a)
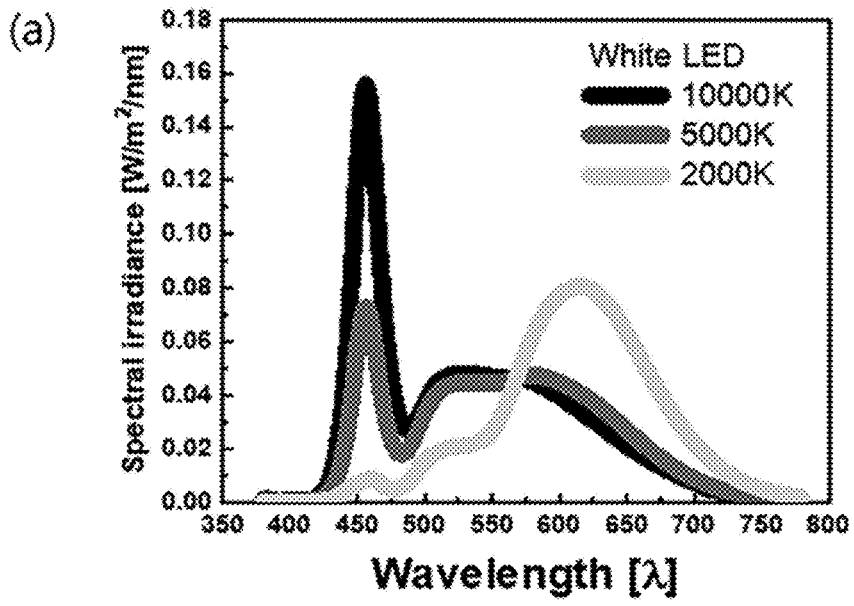
FIG. 14
(b)
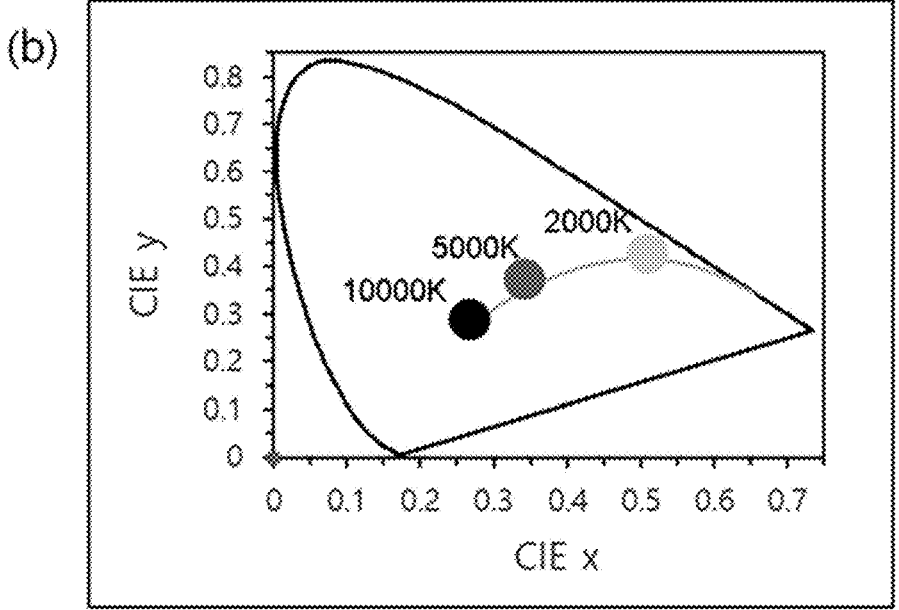

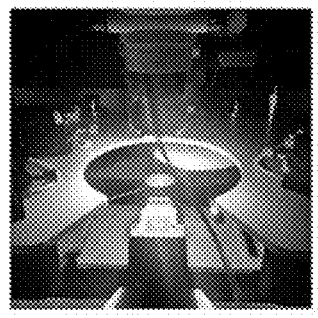
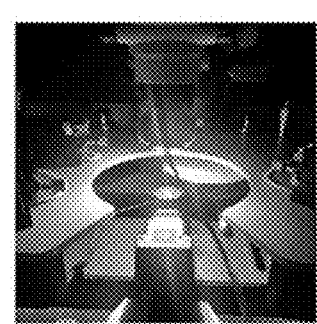
2000K        5000K        10000K
※ Measured by CL500A
| Color temperature (K) | R | G | B | VIL (lux) | CIL (lx/lx) | CAF |
|---|---|---|---|---|---|---|
| 2000K | 95 | 44 | 8 | 95 | 3118 | 746 | 0.239 |
| 5000K | 35 | 90 | 33 | 35 | 3117 | 2263 | 0.726 |
| 10000K | 25 | 95 | 66 | 25 | 3191 | 3802 | 1.192 |
FIG. 15

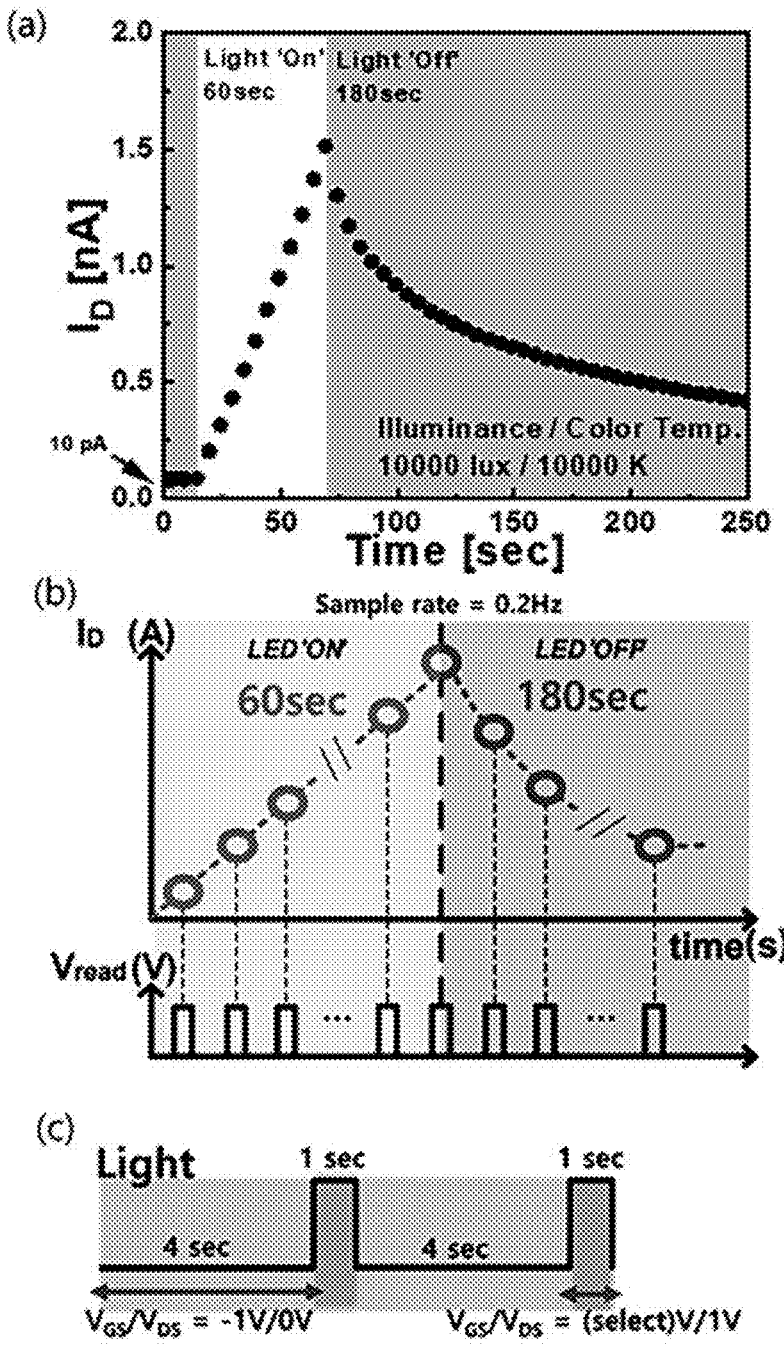
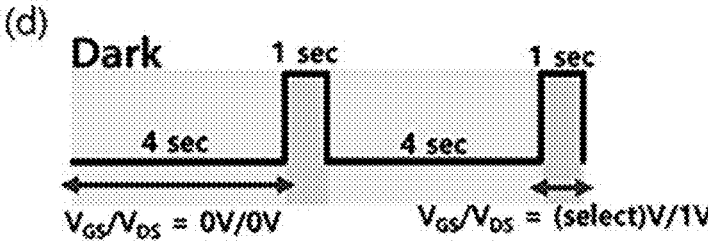
FIG. 17

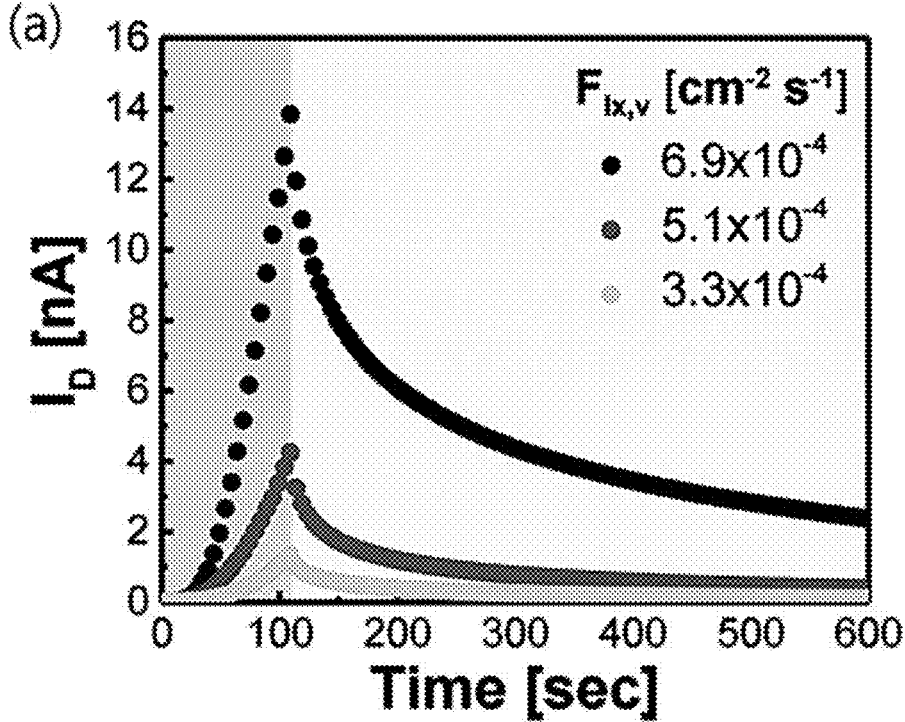
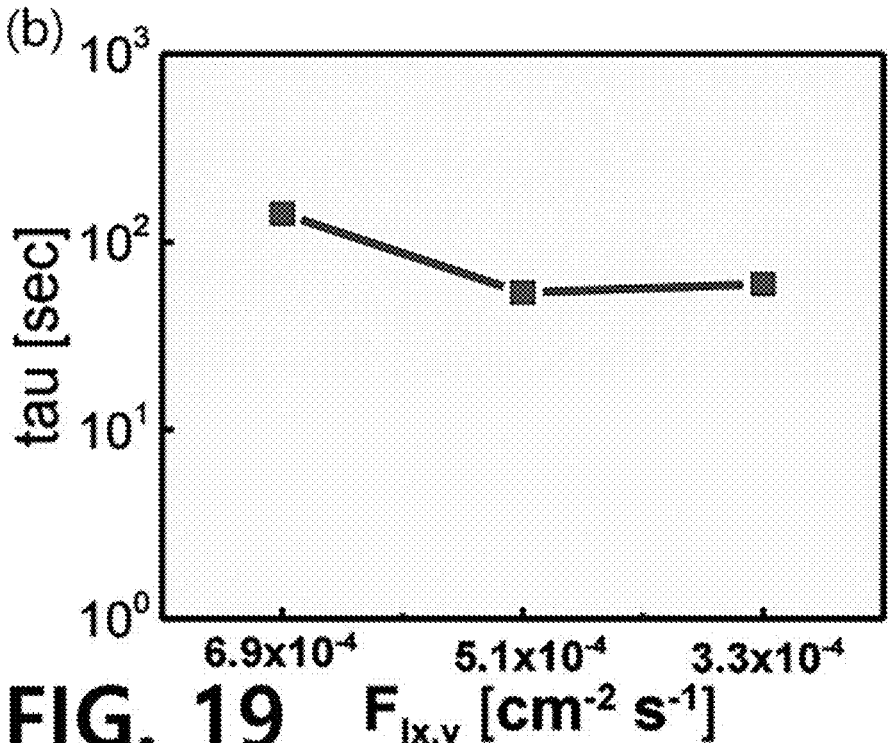
FIG. 19

SiO₂          a-IGZO          Visible Light

V_G<0V

— Subgap states          ● Electron (a)

(b)

$G_R = 1/R_R = I/(V_y - V_x)$ $G_T = 1/R_T = I/V_x$

1T + 1R (memristor)

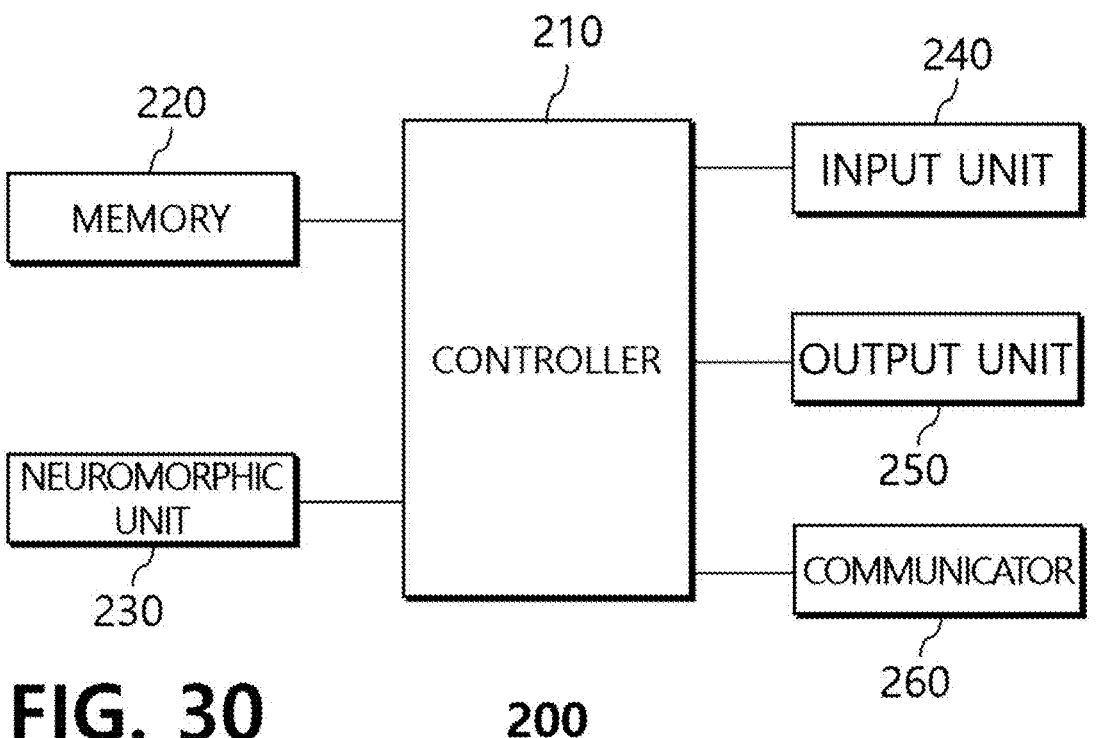
FIG. 30        <u>200</u>

OPTICAL PROPERTY STORAGE DEVICE AND SYSTEM USING SAME

CROSS-REFERENCE TO RELATED APPLICATIONS

This application is a U.S. National Phase Application under 35 U.S.C. 371 of International Application No. PCT/KR2022/005029, filed on Apr. 7, 2022, which claims priority to and the benefit of Korean Patent Application No. 10-2021-0069283, filed on May 28, 2021. The entire disclosures of the above applications are incorporated herein by reference.

TECHNICAL FIELD

The present invention relates to an optical property storage device and a system using the same, and more specifically to a device which is capable of varying resistance (variable conductance) according to the optical properties of color temperature and illuminance of an ambient light environment and storing the variable resistance, and a system using the corresponding device.

BACKGROUND ART

Humans live with a daily cycle, which is called circadian rhythm (or biorhythm), and this circadian rhythm is most affected by light. In other words, humans who have survived in the light environment changes of day and night of 24 hours a day have a corresponding circadian rhythm.

If humans are only exposed to natural light in a 24-hour time zone, the circadian rhythm will follow normally. However, if humans are exposed to artificial light in the evening, the secretion of melatonin is suppressed, and the circadian rhythm may deviate from the normal such that sleep may be disturbed.

That is, according to recent bio- and medical-related research groups, it has been reported that light emitted by artificial lighting greatly affects human circadian rhythm. In particular, the circadian rhythm is most affected by blue light at a wavelength of about 450 nm to about 470 nm, and this is because blue light at that wavelength inhibits melatonin distribution in humans.

Herein, melatonin is a biological compound having antioxidant and anticancer properties, and when the secretion of melatonin increases, the human circadian clock judges it as night, and conversely, when the secretion of melatonin decreases, the human circadian clock judges it as day.

Diseases caused by the disturbance of circadian rhythm include seasonal affective disorder, sleep disorder, depression, jet lag and health diseases associated with shift work. For the treatment of these diseases, it is necessary to balance the circadian rhythm by suppressing the secretion of melatonin in the morning and allowing the secretion of melatonin to occur easily in the evening.

Meanwhile, general illuminance measurement devices measure the illuminance (Lux) of external light by using a visual wavelength filter (Visual Lambda Filter: V(λFilter)) that follows the light sensitivity characteristic curve for the human eye, that is, the visual sensitivity curve. Herein, illuminance (Lux) means the intensity of light that can be perceived by the human eye, and it is also referred to as visual luminance (Lux) to distinguish from bio-illuminance (also referred to as "circadian luminance" or "non-visual luminance"), which will be described below.

According to such a visual sensitivity curve, the light having a wavelength range of about 380 nm to 780 nm has maximum sensitivity. However, visual illuminance values measured by general illuminance measuring devices following a visual sensitivity curve may be different from bio-illuminance values that affect the human circadian rhythm.

This is because the emission spectrum changes depending on the type of external light source, and when the emission spectrum is different, the light sensitivity properties for hormones governing the circadian rhythm also change.

Particularly, in order to measure bio-illuminance or diagnose circadian rhythm, it is necessary to measure the optical property information of visual illuminance and color temperature of an ambient light environment. In this case, the color temperature may be referred to as a color according to the intensity of each wavelength of light, and the visual illuminance may be referred to as the intensity of light (i.e., the number of photons) under a specific color temperature.

As the color temperature is higher, the blue light component is stronger, thereby suppressing the secretion of melatonin hormone, and as the color temperature is lower, the amber component is stronger, thereby promoting melatonin secretion. For example, 10,000K corresponds to the color temperature of natural light from noon to 2:00 PM, and 3,000K corresponds to the color temperature of natural light around 7:00 PM.

That is, since sunrise and sunset have similar illuminance but different color temperatures, human non-visual biological clocks can distinguish between day and night, thereby regulating the secretion of hormones such as melatonin.

Meanwhile, in order to obtain the optical property information of visual illuminance and color temperature in the related art, expensive sensors and detectors have to be used, which not only requires high costs, but also has limitations in miniaturizing devices due to the characteristics of the sensors and detectors.

However, the above information merely provides background information on the present invention and does not correspond to previously disclosed techniques.

DISCLOSURE

Technical Problem

In order to solve the problems of the related art as described above, an object of the present invention is to provide a device and system which are capable of varying resistance (variable conductance) according to the optical properties of color temperature and illuminance of an ambient light environment and storing the varied resistance.

In addition, another object of the present invention is to provide a device and system for perform various applications, such as measuring values for color temperature and illuminance of an ambient light environment, measuring bio-illuminance that affects circadian rhythm, or self-diagnosing the corresponding circadian rhythm, by using storage information of an optical property storage device.

However, the problems to be solved by the present invention are not limited to the above-mentioned problems, and other problems that are not mentioned will be clearly understood by those skilled in the art from the description below.

Technical Solution

In order to solve the above-described problems, the device according to an exemplary embodiment of the present invention includes a light transistor in which the conductance between a source electrode and a drain electrode changes in accordance with optical properties of color temperature and illumination of incident light; and a variable resistance memory device of two terminals in which a first electrode is electrically connected to any one electrode from among the source and drain electrodes of the light transistor, and which stores a conductance changing in accordance with the changed conductance of the light transistor.

After applying the voltage of a potentiation pulse to a second electrode of the variable resistance memory device, the voltage of a depression pulse may be applied to store variable conductance reflecting the optical properties.

A voltage that turns on the light transistor may be applied to a gate electrode of the light transistor to perform a first sampling process in which the influence of incident light is reflected.

During the first sampling process, the voltage of a potentiation pulse may be applied to a second electrode of the variable resistance memory device.

The conductance of the variable resistance memory device may be varied to gradually increase while reflecting the optical properties as the potentiation pulse is applied in the first sampling process.

After the first sampling process, the voltage of a reading mode that derives information about variable conductance stored in the variable resistance memory device according to the first sampling process may be applied to the second electrode of the variable resistance memory device.

After the first sampling process, a voltage that turns off the light transistor may be applied to a gate electrode of the light transistor, and a second sampling process is performed in which the influence of incident light is reduced or blocked.

During the second sampling process, the voltage of a depression pulse may be applied to the second electrode of the variable resistance memory device.

The conductance of the variable resistance memory device may be varied to gradually decrease while reflecting the optical properties as the depression pulse is applied in the second sampling process.

After the second sampling process, the voltage of a reading mode that derives information about variable conductance stored in the variable resistance memory device according to the second sampling process may be applied to the second electrode of the variable resistance memory element.

After the second sampling process, a voltage for resetting the light transistor may be applied to a gate electrode of the light transistor.

When the incident light has optical properties with different color temperatures even if the illuminance is the same, or has optical properties that have different illuminances even if the color temperature is the same, the conductance of the variable resistance memory device, which changes depending on the application of the voltage, may vary in different patterns.

Each variable conductance of the variable resistance memory device for each incident light of red light, green light and blue light may have a different start conductance value and end conductance value, and a different variation between the start conductance and the end conductance according to the application of the voltage of the potentiation pulse.

The variable resistance memory device may include any one of a memristor, Resistive Random Access Memory (RRAM), Phase-change Random Access Memory (PcRAM), Magnetic Random Access Memory (MRAM), Ferroelectric Random Access Memory (FeRAM) and Conductive Bridging Random Access Memory (CBRAM).

The device according to another exemplary embodiment of the present invention includes a light transistor in which the conductance between a source electrode and a drain electrode changes in accordance with optical properties of color temperature and illumination of incident light; and a memristor device of two terminals which is respectively provided with a first electrode that is electrically connected to any one electrode of the source and drain electrodes of the light transistor, a resistance change layer that is provided on the first electrode and in which a resistance change occurs in accordance with the applied voltage between the two electrodes, and a second electrode that is provided on the resistance change layer and to which the voltage of a depression pulse is applied after the voltage of a potentiation pulse is applied.

The memristor device may store conductance that changes according to the varied conductance of a light transistor.

The resistance change layer may be composed of an oxide material, and the memristor device may have a conductance that changes in accordance with the movement of oxygen charges according to the voltage applied to the second electrode.

A channel layer of the light transistor and a resistance change layer of the memristor may be composed of the same oxide material.

The resistance change layer may be composed of a metal-oxide material with the highest reactivity to blue light among red light, green light and blue light.

When the voltage of a potentiation pulse is applied, the variable conductance of the resistance change may have the largest start and end conductance values or the largest variation between the start conductance and end conductance layer when blue light is the incident light, compared to when red light and green light are the incident light.

The system according to an exemplary embodiment of the present invention includes a device for changing conductance in accordance with the optical properties of color temperature and illuminance of incident light and storing the changed conductance; a machine learning model which is pre-trained to output result information related to the optical properties of incident light, circadian illuminance or circadian rhythm from input information about variable conductance reflecting the optical properties of the incident light; and a controller for controlling to input the input information about variable conductance stored in the device into the machine learning model and output the result information.

The device may include a light transistor in which the conductance between a source electrode and a drain electrode changes in accordance with optical properties of color temperature and illumination of incident light; and a variable resistance memory device in which a first electrode is connected to any one electrode from among the source and drain electrodes of the light transistor, and which stores a conductance changing in accordance with the changed conductance of the light transistor.

When the voltage of a potentiation pulse is applied, the variable resistance memory device may store information about a first variable conductance, and then store information about a second variable conductance when the voltage of a depression pulse is applied thereafter.

The controller may input the input information including information about the first variable conductance and second variable conductance into the machine learning model.

Advantageous Effects

The present invention configured as described above has the advantage of being able to vary resistance (variable conductance) according to the optical properties of color temperature and illuminance of an ambient light environment and store the variable values.

In addition, the present invention has the advantages of being able to perform various applications simply and quickly, such as measuring values for color temperature and illuminance of an ambient light environment, measuring bio-illuminance that affects circadian rhythm, or self-diagnosing the corresponding circadian rhythm, by using the storage information of an optical property storage device.

The effects that can be obtained in the present invention are not limited to the above-mentioned effects, and other effects that are not mentioned will be clearly understood by those skilled in the art from the description below.

DESCRIPTION OF DRAWINGS

FIG. 3 shows an example of the device 10 implemented by using a memristor device 120.

FIG. 5 shows the results of applying programming pulses ($V_{pulse}$) of potentiation and depression to the memristor device (1R).

FIG. 6 shows the results of applying a sweep voltage ($V_{sweep}$) to the device (1T1R) of the transistor and memristor device.

FIG. 7 shows results of applying programming pulses ($V_{pulse}$) of potentiation and depression to the device (1T1R) of the transistor and memristor device.

FIG. 10 shows a conceptual diagram of the principle of classifying illuminance and color temperature in incident light.

FIGS. 14 and 15 show information about light sources having various color temperatures that are controlled and output from LEDs.

FIG. 17 shows a graph related to the photoresponsivity of the light transistor (1T) with respect to a light source having an illuminance of 10,000 lux and a color temperature of 10,000K.

FIG. 19 is a graph of the photoresponsivity of the light transistor (1T) according to an increase in the illuminance of blue light.

FIG. 30 shows a block diagram of the system 200 according to an exemplary embodiment of the present invention.

MODES OF THE INVENTION

Figure 1:
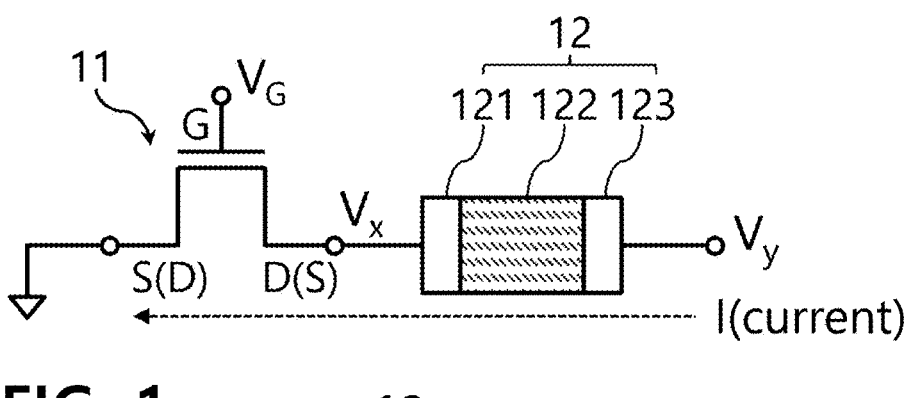
FIG. 1 shows the configuration of a device 10 according to an exemplary embodiment of the present invention.

The above objects and means of the present invention and effects thereof will become more apparent through the following detailed description in relation to the accompanying drawings, and accordingly, those of ordinary skill in art to which the present invention pertains may easily practice the technical spirit of the present invention. Additionally, in terms of describing the present invention, when it is determined that the detailed description of a known technology related to the present invention may unnecessarily obscure the gist of the present invention, the detailed description thereof will be omitted.

The terms used in the present specification are for describing exemplary embodiments and are not intended to limit the present invention. In the present specification, the singular form also includes the plural form in some cases unless specifically stated in the phrase. In the present specification, terms such as "comprise", "provide with", "include" or "have" do not exclude the presence or addition of one or more other constituent elements other than the mentioned constituent elements.

In the present specification, terms such as "or", "at least one" and the like may represent one of words listed together, or a combination of two or more. For example, "A or B" and "at least one of A and B" may include only one of A or B, and may include both A and B.

In the present specification, the description following "for example" may not exactly match the information presented, such as the recited characteristics, variables, or values, and the exemplary embodiments of the invention according to various examples of the present invention should not be limited to effects such as variations including tolerances, measurement errors, limitations of measurement accuracy and other commonly known factors.

In the present specification, when a component is described as being 'connected' or 'joined' to another component, it may be directly connected or joined to the other component, but it should be understood that other components may be present in the middle. On the other hand, when a component is referred to as being 'directly connected' or 'directly joined' to another component, it should be understood that there is no other component in the middle.

In the present specification, when a component is described as being 'on' or 'adjacent' of another component, it may be directly in contact with or connected to another component, but it should be understood that another component may be present in the middle. On the other hand, when a component is described as being 'directly above' or 'directly adjacent' of another component, it may be understood that another component does not exist in the middle. Other expressions describing the relationship between components, for example, 'between' and 'directly between' can be interpreted in this way.

In the present specification, terms such as 'first' and 'second' may be used to describe various components, but the corresponding components should not be limited by the above terms. In addition, the above terms should not be interpreted as limiting the order of each component, and may be used for the purpose of distinguishing one component from another component. For example, the 'first component' may be named as the 'second component', and similarly, the 'second component' may also be named as the 'first component.'

Unless otherwise defined, all terms used in the present specification may be used with meanings that can be commonly understood by those of ordinary skill in the art to which the present invention pertains. In addition, terms defined in a commonly used dictionary are not interpreted ideally or excessively unless explicitly defined specifically.

In the present specification, "potentiation mode" relates to an operation of lowering the resistance of a variable resistance memory device and device by applying continuous positive pulses (i.e., an operation of increasing conductance), and the corresponding pulse is referred to as a "potentiation pulse." In addition, the "depressing mode" is related to an operation of increasing the resistance of a variable resistance memory device and device by applying continuous negative pulses (i.e., an operation of lowering conductance), and the corresponding pulse is referred to as a "depression pulse". In addition, these operations are collectively referred to as "programming".

That is, "programming" may encompass all operations for changing the resistance (conductance) of a variable resistance memory device and device. When the variable resistance memory device operates in the "potentiation mode", the conductance increases such that a progressively higher voltage/current may be output, and when the variable resistance memory device operates in the "depressing mode", the conductance decreases such that a progressively lower voltage/current may be output. In addition, voltage and current may be interpreted as having the same or interchangeable meanings. In addition, resistance variation (modulation, change, switching) and conductance variation (modulation, variation, switching) may be interpreted as having the same or compatible meaning, but their sizes may change in inverse proportion to each other.

Hereinafter, a preferred exemplary embodiment according to the present invention will be described in detail with reference to the accompanying drawings.

Figure 2:
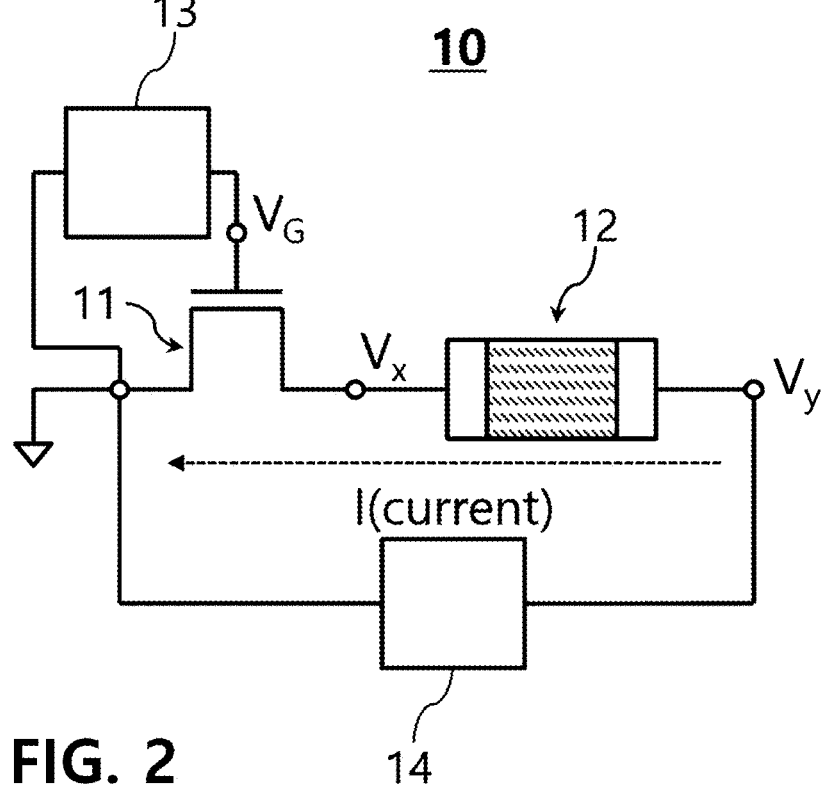
FIG. 2 shows the device 10 according to an exemplary embodiment of the present invention that further includes a configuration for applying a gate voltage and a programming voltage.

FIG. 1 shows the configuration of a device 10 according to an exemplary embodiment of the present invention, and FIG. 2 shows the device 10 according to an exemplary embodiment of the present invention further including a configuration for applying a gate voltage and a programming voltage.

The device 10 according to an exemplary embodiment of the present invention is a device that is capable of varying conductance according to optical properties of incident light (i.e., a surrounding light environment) and storing the varied conductance. In this case, the optical properties include color temperature and illuminance, and the color temperature and illuminance correspond to independent variables that vary the conductance of the device 10, respectively. That is, the device 10 is capable of varying the conductance and storing the changed conductance according to the color temperature and illuminance of the incident light.

To this end, as illustrated in FIG. 1, the device 10 includes one light transistor 11 and one variable resistance memory device 12. Hereinafter, this structure is also referred to as "1T1R."

The light transistor 11 may sense incident light and convert into an electrical signal, and it is a semiconductor device having three terminals of a gate electrode (gate, G), a source electrode (source, S) and a drain electrode (drain, D). The light transistor 11 has high sensitivity to light based on transistor driving.

The light transistor 11 outputs a signal (current) from the drain electrode D to the source electrode S or from the drain electrode D to the source electrode according to incident light. In this case, the magnitude of the corresponding current may vary according to optical properties of incident light in the visible ray region, that is, color temperature (combination of R, G, B) and illuminance. That is, the amount of current in the light transistor 11 changes. That is, in the light transistor 11, the conductance between the drain electrode D and the source electrode S may vary according to optical properties of incident light. Certainly, in the light transistor 11, the magnitude of a signal (current) that is output to the source electrode S or drain electrode D may be adjusted according to the gate voltage $V_G$ that is applied to the gate electrode G.

The color temperature and illuminance of the incident light correspond to independent variables that vary the conductance between the drain electrode D and the source electrode S in the light transistor 11 ($G_T$). Certainly, the gate voltage ($V_G$) also corresponds to an independent variable that changes the conductance ($G_T$) between the drain electrode (D) and the source electrode (S).

In summary, it may be expressed as $G_T = f(V_G, CCT, lux)$. Herein, $G_T$ is the conductance of the light transistor 11 (i.e., the conductance between the source electrode S and the drain electrode D of the light transistor 11), f is a function, $V_G$ is the gate voltage, CCT represents the color temperature of the incident light, and lux represents the illuminance of the incident light, respectively.

For example, the light transistor 11 may be a bipolar transistor-based method or a field effect transistor-based method, but the present invention is not limited thereto.

In the light transistor 11, any one of the source electrode S and the drain electrode D may be electrically connected to the first electrode 121 of the variable resistance memory device 12, and the other one may be electrically connected to ground or the like, have. For example, when the light transistor 11 is N-type, the drain electrode D may be connected to the first electrode 121 of the variable resistance memory device 12, the source electrode S may be connected to ground and the like, and the output signal may also be referred to as "$I_{DS}$." In addition, when the light transistor 11 is P-type, the source electrode S may be connected to the first electrode 121 of the variable resistance memory device 12 and the drain electrode D may be connected to ground, respectively, and the output signal may also be referred to as "$I_{SD}$." However, the light transistor 11 will be described below as an N-type transistor, but the present invention is not limited thereto.

The variable resistance memory device 12 is a device which is capable of varying resistance (variable conductance) according to the applied memory signal of a potentiation mode or a depressing mode, and it is a device having two terminals of first and second electrodes 121, 123. The variable resistance memory device 12 has a characteristic of maintaining (storing) resistance (conductance) according to a history of a programming voltage signal in a previously input potentiation or depressing mode. Information on resistance (conductance) being maintained (stored) may be derived when the voltage signal in a reading mode is applied.

For example, the variable resistance memory device 12 may include at least any one of a memristor, Resistive Random Access Memory (RRAM), Phase-change Random Access Memory (PcRAM), Magnetic Random Access Memory (MRAM), Ferroelectric Random Access Memory (FeRAM) and Conductive Bridging Random Access Memory (CBRAM).

Meanwhile, referring to FIG. 2, a gate voltage ($V_G$) may be applied to the gate electrode (G) of the light transistor 11 by a first power supply device 13 which is connected between the gate electrode (G) and the source electrode (S) or between the gate electrode (G) and the drain electrode (D). That is, the first power supply device 13 is a device ($V_G$ dynamic controller) that adjusts and applies the gate voltage ($V_G$) of the light transistor 11, and during operation, by varying the gate voltage ($V_G$) of the light transistor 11 by receiving a feedback on the conductance ($G_R$) value of the variable resistance memory device 12, it may be used to optimize the voltage ratio applied to the light transistor 11 and the variable resistance memory device 12 according to changes in operating current.

In addition, a programming voltage may be applied to the second electrode 123 of the variable resistance memory device 12 by a second power supply 14 which is connected between the other one electrode of the source electrode (S) and drain electrode (D) of the light transistor 11 and the second electrode 123 of the variable resistance memory device 12. That is, the second power supply device 14 may apply a programming voltage of a depression pulse to the second electrode 123 of the variable resistance memory device 12 after applying the programming voltage of a potentiation pulse.

Depending on the number of pulses of the programming voltage applied to the second electrode 123 of the variable resistance memory device 12, the conductance ($G_R$) of the variable resistance memory device 12 is analogously varied. In this case, when a potentiation pulse, which is a positive pulse, is applied, $G_R$ gradually increases (potentiation), and when a depression pulse, which is a negative pulse, is applied, $G_R$ gradually decreases (depression).

In particular, the variable resistance memory device 12 is electrically connected in series with the light transistor 11. That is, in the variable resistance memory device 12, the first electrode 121 is electrically connected to any one electrode of the source electrode (S) and the drain electrode (D) of the light transistor 11. Accordingly, according to the varied conductance ($G_T$) between the source electrode (S) and the drain electrode (D) of the light transistor 11, the conductance ($G_R$) is changed and stored in the variable resistance memory device 12 according to the applied programming voltage.

That is, the conductance ($G_R$) of the variable resistance memory device 12 is changed according to the programming voltage while reflecting the conductance ($G_T$) of the light transistor 11, which is changed according to the optical properties of incident light. As a result, the conductance ($G_R$) of the variable resistance memory device 12 is changed by reflecting the optical properties (color temperature and illuminance) of incident light incident on the light transistor 11 and stored in the variable resistance memory device 12.

Accordingly, the color temperature and illuminance of incident light correspond to independent variables that vary the conductance ($G_R$) of the variable resistance memory device 12. Certainly, the programming voltage signal applied to the second electrode 123 of the variable resistance memory device 12 also corresponds to an independent variable for varying the conductance ($G_R$) of the variable resistance memory device 12.

In summary, it can be expressed as $G_R=f(V_P, CCT, lux)$. Herein, GR is the conductance of the variable resistance memory device 12, f is a function, $V_P$ is the programming voltage of a potentiation mode or depressing mode, CCT represents the color temperature of the incident light, and lux represents the illuminance of the incident light, respectively. 3 shows an example of the device 10 which is implemented by using a memristor device 120.

For example, as illustrated in FIG. 3, the variable resistance memory device 12 may be formed of a memristor device 12'. Hereinafter, a case in which the variable resistance memory device 12 is formed of a two-terminal memristor device 12' will be described, but the present invention is not limited thereto. That is, the connection to the memristor device 12', each signal (memory signal, etc.) applied to the memristor device 12'/device 10, the characteristics of the memristor device according to the applied signal and the like may also be applied to the other types of 2-terminal variable resistance memory devices.

Referring to FIG. 3, the memristor device 12' according to an exemplary embodiment of the present invention is a device which is capable of varying resistance (i.e., variable conductance) and storing the variable resistance. In this case, the memristor device 12' may include a first electrode 121, a resistance change layer 122 and a second electrode 123, which may have a structure in which they are sequentially stacked. This memristor device 12' is a two-terminal device by the first electrode 121 and the second electrode 123.

First of all, the first electrode 121 is a configuration constituting one end of the memristor device 12', and includes a conductive material. In this case, the first electrode 121 is electrically connected to any one of the source electrode (S) and drain electrode (D) of the light transistor 11. That is, the first electrode 121 may act as a bottom electrode (BE).

The second electrode 123 is a configuration constituting the other end of the memristor device, includes a conductive material, and receives various signals (memory signals, etc.) for programming the memristor device. That is, the second electrode 123 is provided on a resistance change layer 122 and may serve as an oxygen reservoir layer while serving as a top electrode (TE). A voltage having a potential difference equal to $V_{TE}$ with respect to the first electrode 121 or the ground may be supplied to the second electrode 123.

For example, the first electrode 121 or the second electrode 123 may include at least one material selected from Cu, Ni, Ti, Hf, Zr, ZN, W, Co, V, Al, Ag, C, Pd, Pt, ITO and the like, but the present invention is not limited thereto.

The resistance change layer 122 includes an oxide material and is provided on the first electrode 121. The resistance change layer 122 may function as a memristor layer. That is, the resistance change layer 122 may have a resistance change according to an applied voltage between the first and second electrodes 121, 123 and may have a characteristic of storing the changed resistance value according to the applied voltage. In particular, the resistance change layer 122 may include an oxygen-containing metal-oxide material to enable various resistance switching by affecting the effective SB height ($\Phi_B$) according to the content of oxygen ions.

For example, the resistance change layer 122 may have the following characteristics. First of all, in the resistance change layer 122, the Schottky barrier height (D B may decrease as $V_{TE}$ increases. In addition, a depletion phenomenon may occur in the resistance change layer 122 due to a part of the applied voltage. In addition, in the resistance variation layer, the Fermi-energy level (EF) may change between the maximum valence band maximum energy level (EV) and the minimum conduction band minimum energy level (EC) such that it is possible to maintain a stable state. In addition, the resistance change layer 122 may limit a decrease of the Fermi-energy level (EF) according to the generation of ionized oxygen vacancies ($V_O^{2+}$) and an increase in electron concentration when $V_{TE}$ increases. Further, in the resistance variation layer 122, the Fermi-energy level (EF) may be aligned with a peak level of oxygen vacancies (VO) in a density of state.

For example, the resistance change layer 122 may include a metal-oxide material of 3 or more elements, such as IGZO, ITZO, IWZO, ZSO, IZO, or IGO, which enables monolithic integration by utilizing each variable resistance memory device 12 and the light transistor 11 as one material, but the present invention is not limited thereto.

Meanwhile, an insulating layer (not illustrated), which is made of a non-conductive material, may be formed between the first electrode 121 and the resistance change layer 122. This insulating layer may be formed to be thinner than the first electrode 121 and the resistance change layer 122. In this case, the insulating layer may form a Schottky barrier ($S_B$) and act as a type of tunnel barrier at an interface between the first electrode 121 and the resistance change layer 122.

In this case, the corresponding insulating layer may have the following characteristics. That is, the insulating layer may gradually decrease the Schottky barrier height ($\Phi_B$) as a potentiation pulse having a predetermined maximum voltage is repeatedly provided. In addition, the insulating layer may include an oxide material, and the Schottky barrier height ($\Phi_B$) may decrease according to an increase in the oxygen ion content during a potentiation pulse.

Meanwhile, referring to FIG. 3, the light transistor 11 may include a gate electrode 111, a source electrode 112, a drain electrode 113, a gate insulating layer 114 and a channel material layer 115.

The gate electrode 111, the source electrode 112 and the drain electrode 113 include a conductive material. The source electrode 112 and the drain electrode 113 may be spaced apart from each other on the channel material layer 115. For example, the gate electrode 111, the source electrode 112 and the drain electrode 113 may include at least one material selected from Cu, Ni, Ti, Hf, Zr, ZN, W, Co, V, Al, Ag, C, Pd, Pt, ITO and the like, but the present invention is not limited thereto.

The gate insulating layer 114 includes a non-conductive material and may be formed to be thicker than the channel material layer 115 on the gate electrode 111. In this case, the gate insulating layer 114 may act as a type of tunnel barrier at the interface between the source and drain electrodes 112, 113.

The channel material layer 115 includes an oxide material and may be provided on the gate insulating layer 114 to form a channel layer between the source and drain electrodes 112, 113. Such a channel layer may be changed according to a gate voltage.

For example, in the light transistor 11, a gate electrode 111, a gate insulating layer 114, a channel material layer 115, a source electrode 112 and a drain electrode 113 may be sequentially stacked on a substrate (S). In this case, the first electrode 121, the resistance change layer 122 and the second electrode 123 of the memristor device 12' may be sequentially stacked on the source electrode 112 or the drain electrode 113.

In particular, the channel material layer 115 of the light transistor 11 and the resistance change layer 122 of the variable resistance memory device 12 may be integrated by utilizing the same oxide material (monolithic integration). For example, the channel material layer 115 and the resistance change layer 122 may include a metal-oxide material of 3 or more elements, such as IGZO, ITZO, IWZO, ZSO, IZO, IGO and the like, but the present invention is not limited thereto.

However, such as indium-gallium-zinc-oxide (IGZO), when the channel material layer 115 is a light transistor 11 composed of a metal-oxide material of 3 or more elements (e.g., IGZO, ITZO, IWZO, ZSO, IZO, IGO, etc.), there is an advantage in that the leakage current is small and the on/off current ratio is high compared to other conventional transistors (such as silicon transistors). In this case, since a high on/off current ratio can be obtained with a small change in gate voltage, it may be more advantageous to secure multi-levels. Further, in this case, there is an advantage in that the light transistor 11 and the variable resistance memory device 12 can be integrated on a flexible substrate (S) such as polyimide and the like.

Meanwhile, the resistance change layer 122 may be formed of a metal-oxide material in which a change in conductance ($G_R$) occurs in the visible ray region. In particular, the resistance change layer 122 may be formed of a metal-oxide material having the highest reactivity to incident blue light among red light, green light and blue incident light, that is, the greatest change in conductance ($G_R$).

In this case, the memristor device 12' has an advantage of being able to simulate the reactivity of human non-visual senses. That is, blue light is a major factor that inhibits melatonin distribution in humans, and it has the highest reactivity in human non-visual senses.

Accordingly, the reactivity of the resistance change layer 122 to incident light of blue light may be expressed as the following characteristics. That is, when a potentiation pulse or a decrease pulse programming voltage is applied to the memristor device 12', the variable conductance ($G_R$) of the resistance change layer 122 is greater when blue light is incident light than when red light and green light are incident light. The start conductance value may be the largest (first condition), the end conductance value may be the largest (second condition), or the variation between the start conductance and the end conductance may be the largest (third condition). Certainly, the first and second conditions may be satisfied, the first and third conditions may be satisfied, the second and third conditions may be satisfied, or both of the first to third conditions may be satisfied.

For example, the oxide having the highest reactivity to incident blue light may be a metal-oxide material (IGZO, ITZO, IWZO, ZSO, IZO, IGO, etc.) of 3 or more elements such as indium-gallium-zinc-oxide (IGZO), but the present invention is not limited thereto.

Hereinafter, experiments were performed to confirm various characteristics of the device 10.

However, in the following, a transistor or light transistor is indicated by "1T" and a memristor device is indicated by "1R". In particular, for the experiments, (1T) and (1R) were each manufactured to have the structure illustrated in FIG. 3, and the (1T) channel material layer 115 and the (1R) resistance change layer 122 were implemented with the same IGZO material.

In addition, the first electrode 121 of the (1R) may be expressed as "BE", the second electrode 123 of the (1R) may be expressed as "TE", the voltage supplied to the second electrode 123 of the (1R) may be expressed as "$V_{TE}$" or "$V_{Mem}$", the current between the second electrode 123 and the first electrode 121 at (1R) may be expressed as "$I_{Mem}$", and the resistance of the resistance change layer 122 at (1R) may be expressed as "$R_{mem}$", respectively.

In addition, the gate voltage of (1T) may be expressed "$V_G$" or "$V_{GS}$", the current between the drain electrode (D) and the source electrode (S) of (1T) may be expressed as "$I_D$" or "$I_DS$", the voltage between the drain electrode and the source electrode (S) of (1T) may be expressed as "$V_D$" or "$V_DS$", and the resistance between the drain electrode (D) and the source electrode (S) of (1T) may be expressed as "$R_{TFT}$", respectively.

In addition, the programming pulse of the potentiation or depression pulse may be expressed as "$V_{pulse}$" or "$V_p$", the color temperature of the incident light may be expressed as "CT" or "CCT", and the illuminance of the incident light may be expressed as "lux", respectively. In this case, the unit of color temperature may be expressed as "K", and the unit of illuminance may be expressed as "lux".

Experiments

Figure 4:
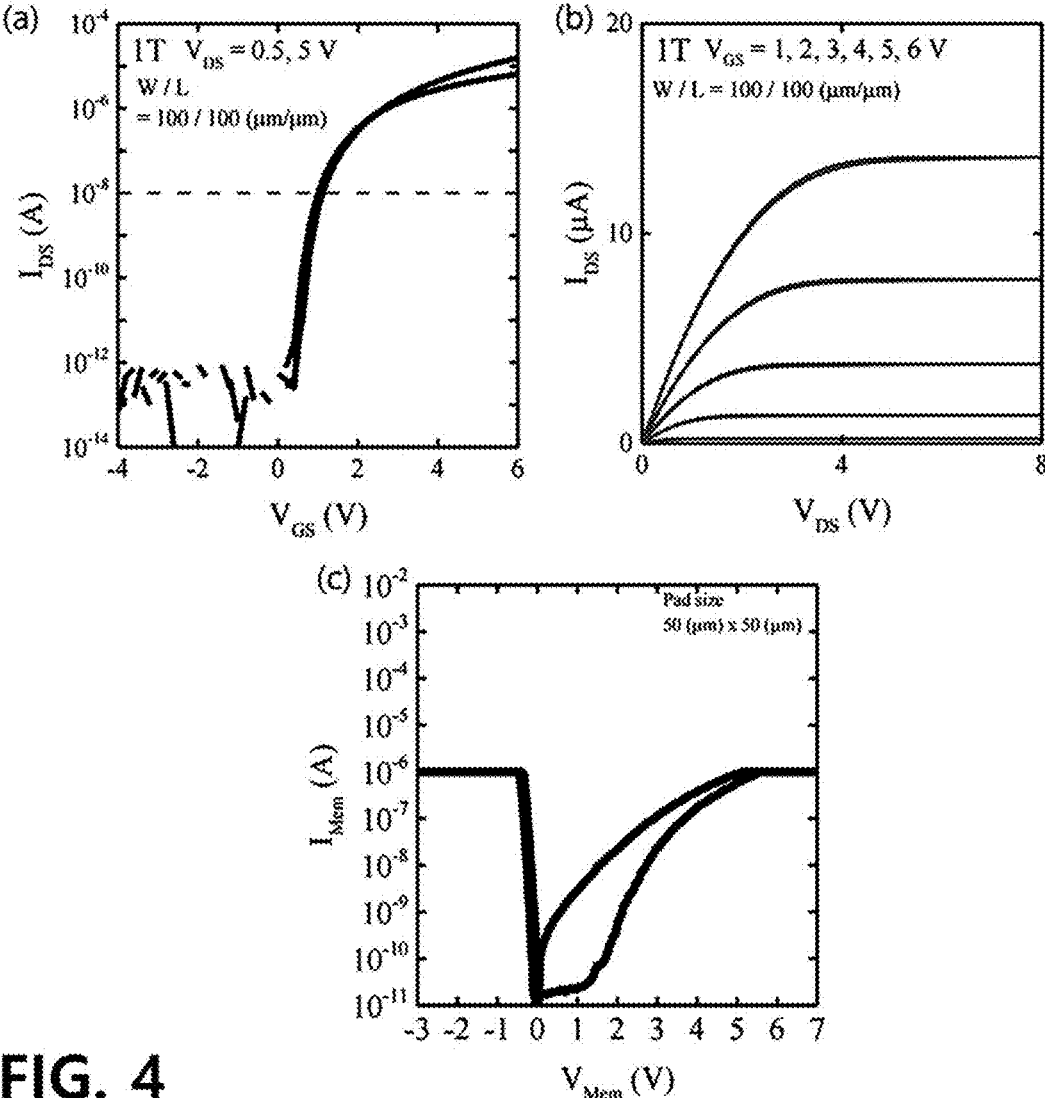
FIG. 4 shows a graph of current-voltage (I-V) properties that are measured for each single device of a light transistor and a memristor device.

FIG. 4 shows a graph of current-voltage (I-V) properties that are measured for each single device of a light transistor and a memristor device.

Prior to the operation experiment of the entire structure of 1T1R, as illustrated in FIG. 4, the current-voltage (IV) characteristics of a single device of the light transistor (1T) and a single device of the memristor device (1R) were measured, respectively. In this case, FIG. 4(*a*) shows $I_DS$ according to $V_{GS}$ in the light transistor (1T), FIG. 4(*b*) shows $I_DS$ according to $V_DS$ in the light transistor (1T), and FIG. 4(*c*) shows $I_{Mem}$ according to $V_{Mem}$ in the memristor (1R), respectively.

FIG. 5 shows the results of applying programming pulses ($V_{pulse}$) of potentiation and depression to the memristor device (1R).

As illustrated in FIG. 5(*a*), $V_{pulse}$ was applied to the second electrode of the memristor device (1R), which is a single device, and as a result, as illustrated in FIGS. 5(*b*) and (*c*), it was confirmed that the memristor device (1R) has synaptic characteristics, but has synaptic characteristics according to the amplitude of the potentiation and depression pulses.

Next, in order to measure the photoresponsivity of the memristor device (1R), an experiment was performed on a device (1T1R) of the transistor and memristor device.

FIG. 6 shows the results of applying a sweep voltage ($V_{sweep}$) to the device (1T1R) of the transistor and memristor device.

As illustrated in FIG. 6(*a*), a sweep voltage ($V_{sweep}$) was applied to the second electrode of the memristor device under various $V_G$ conditions for the device (1T1R) of the transistor and the memristor device. The current ($I_{1T1R}$) flowing through the device (1T1R) according to the $V_{sweep}$ at each $V_G$ was measured. and the results are shown in FIG. 6(*b*). However, since the resistance ($R_{TFT}$) (or conductance) of the transistor (1T) changes according to $V_G$, the transistor (1T) is indicated as a variable resistor in FIG. 6(*a*).

Referring to FIG. 6(*b*), as $V_G$ decreases (←), $R_{TFT}$ of the light transistor (1T) increases (↑), and $V_{mem}$ and $I_{mem}$ decrease (←). In particular, when measurin G1T1R, it was confirmed that the voltage distribution for $V_{sweep}$ occurred well due to a change of $R_{TFT}$ according to $V_G$. In particular, when the $R_{TFT}$ is so large that the transistor (1T) turns off ($V_G$=0.1V), the transistor (1T) itself appears to be a factor determining the compliance current.

FIG. 7 shows results of applying programming pulses ($V_{pulse}$) of potentiation and depression to the device (1T1R) of the transistor and memristor device.

As illustrated in FIG. 7(*a*), $V_{pulse}$ was applied to the second electrode of the memristor device (1R) for the device (1T1R) of the transistor and the memristor device. In this case, $V_G$ was respectively divided into [0.1V, 1V, 3V, 5V, 7V, 9V] and applied. Certainly, the amplitude of $V_{pulse}$ was selected by roughly calculating the voltage applied to the memristor (1R) according to the variable range of $R_{TFT}$ and the resistance ratio of $R_{mem}$. That is, the purpose of this experiment is to check whether information on the changed conductance of the transistor (1T) is stored in the memristor (1R) by reflecting a change of the $R_{TFT}$ according to the $V_G$ of the transistor (1T).

As a result, as illustrated in FIGS. 7(*b*) and 7(*c*), when the same programming pulse is input at each application of $V_G$ from the subthreshold region of the transistor (1T) to the strong 'ON' period, it was confirmed that synaptic properties appeared the memristor in (1R). Through these experimental results, it can be confirmed that information on the varied conductance of the transistor (1T) in the device (1T1R) can be stored in the memristor 1R.

The above-described measurement results related to the transistor (1T) are equally applicable to the light transistor (1T).

Next, an experiment was performed on the photoresponsivity of the light transistor (1T).

Figure 8:
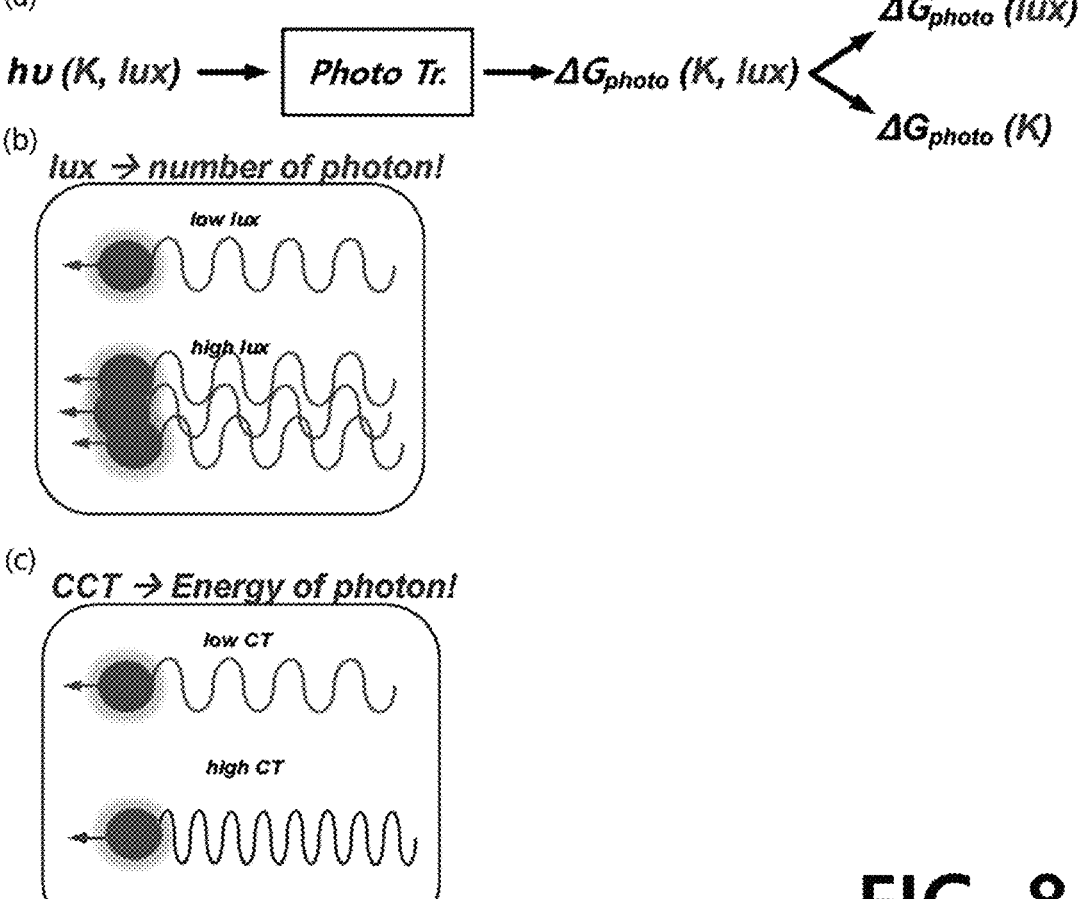
FIG. 8 shows a conceptual diagram of varying conductance according to the optical properties (color temperature and illuminance) of incident light in the light transistor (1T), and a conceptual diagram of color temperature and illuminance, which are optical properties.

FIG. 8 shows a conceptual diagram of varying conductance according to the optical properties (color temperature and illuminance) of incident light in the light transistor (1T), and a conceptual diagram of color temperature and illuminance, which are optical properties.

Referring to FIG. 8(*a*), the light transistor (1T) has photoresponsivity which is capable of discriminating color temperature and illuminance, which are optical properties of incident light. That is, the conductance of the light transistor (1T) may vary according to the color temperature and illuminance of incident light. In this case, as illustrated in FIG. 8(*b*), the illuminance is related to the number of photons of the incident light, and as illustrated in FIG. 8(*c*), the color temperature is related to the photon energy ($E_{ph}$, wavelength) of the incident light.

Figure 9:
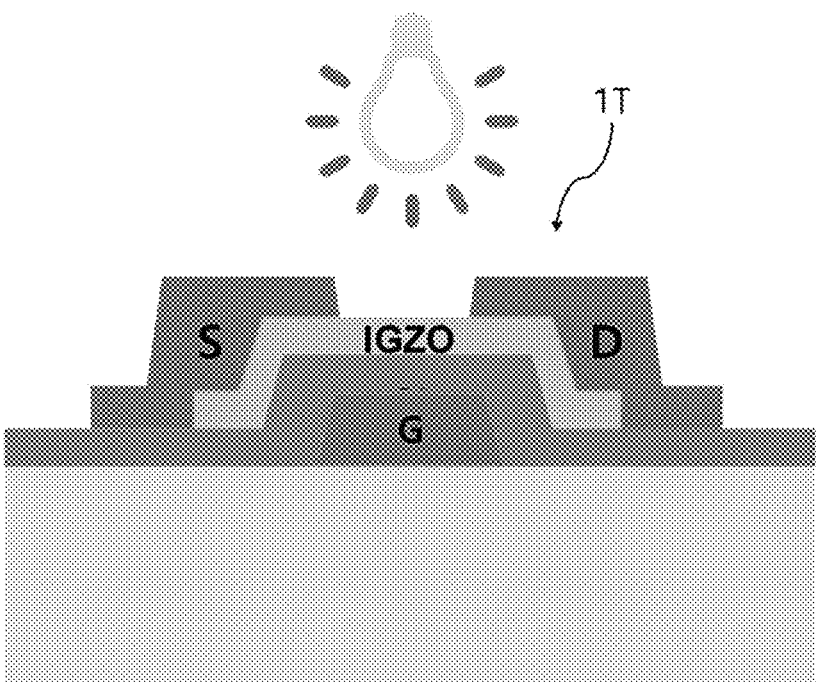
FIG. 9 is a conceptual diagram for measuring photoresponsivity of the light transistor (1T) according to the optical properties (color temperature and illuminance) of incident light.

FIG. 9 is a conceptual diagram for measuring photore-sponsivity of the light transistor (1T) according to the optical properties (color temperature and illuminance) of incident light.

In order to measure the photoresponsivity of the light transistor (1T) according to the optical properties (color temperature and illuminance) of incident light, as illustrated in FIG. 9, an LED device (hereinafter, indicated and referred to as "LED" and referred to), which is capable of adjusting color temperature and illuminance, was used.

In this case, in the light transistor (1T) used in the experiment, the channel material layer 115 was fabricated based on IGZO, and W (width)×L (length) was 100×100 μm².

FIG. 10 shows a conceptual diagram of the principle of classifying illuminance and color temperature in incident light.

For visible light (sub-gap energy), the channel material layer 115 of IGZO is affected by the DoS profile inside the sub-gap, and has a photo-response mechanism that is par-ticularly sensitive to the oxygen vacancy level ($g_{v_o}$) located at the deep level near Ev (ionization of Vo by photo-reaction->photo excitation).

That is, when the incident light of visible light is incident (when the LED is 'on'), the channel material layer 115 of IGZO increases the current ($I_{DS}$) and conductance of the light transistor (1T), and the corresponding increase rate is a function of the color temperature and illuminance that the incident light has.

Similarly, when the incident light of visible light is blocked (when the LED is 'off'), the channel material layer 115 of IGZO reduces the current ($I_{DS}$) and conductance of the light transistor (1T), and the corresponding reduction rate is also a function of the color temperature and illumi-nance that the incident light at the time of incidence.

However, it is difficult to distinguish between color tem-perature and illuminance at these rates of increase and decrease in conductance. Therefore, if two functions of $f_{photo}$(K, lux) and $f_{recovery}$(K, lux) can be obtained by observ-ing the phenomenon of recombination of light response (e.g., neutralization of Vo), the color temperature (CT) and illuminance (lux) may be obtained through the variable equation for the two functions.

Meanwhile, before the LED is turned on, the bias in a dark state that is turned off is applied to the light transistor (1T), and $I_{DS}$ at this time is indicated and referred to as "dark current."

However, the off state of the LED may be implemented by adjusting the gate voltage ($V_{GS}$) of the light transistor (1T) instead of actually turning off the LED. That is, if $V_{GS}$ is applied to the extent that the light transistor (1T) is turned off, the light transistor (1T) operates without being affected by incident light, and this operation is the same as when the LED is off. This operation may be applied to a second sampling process to be described below.

Figure 11:
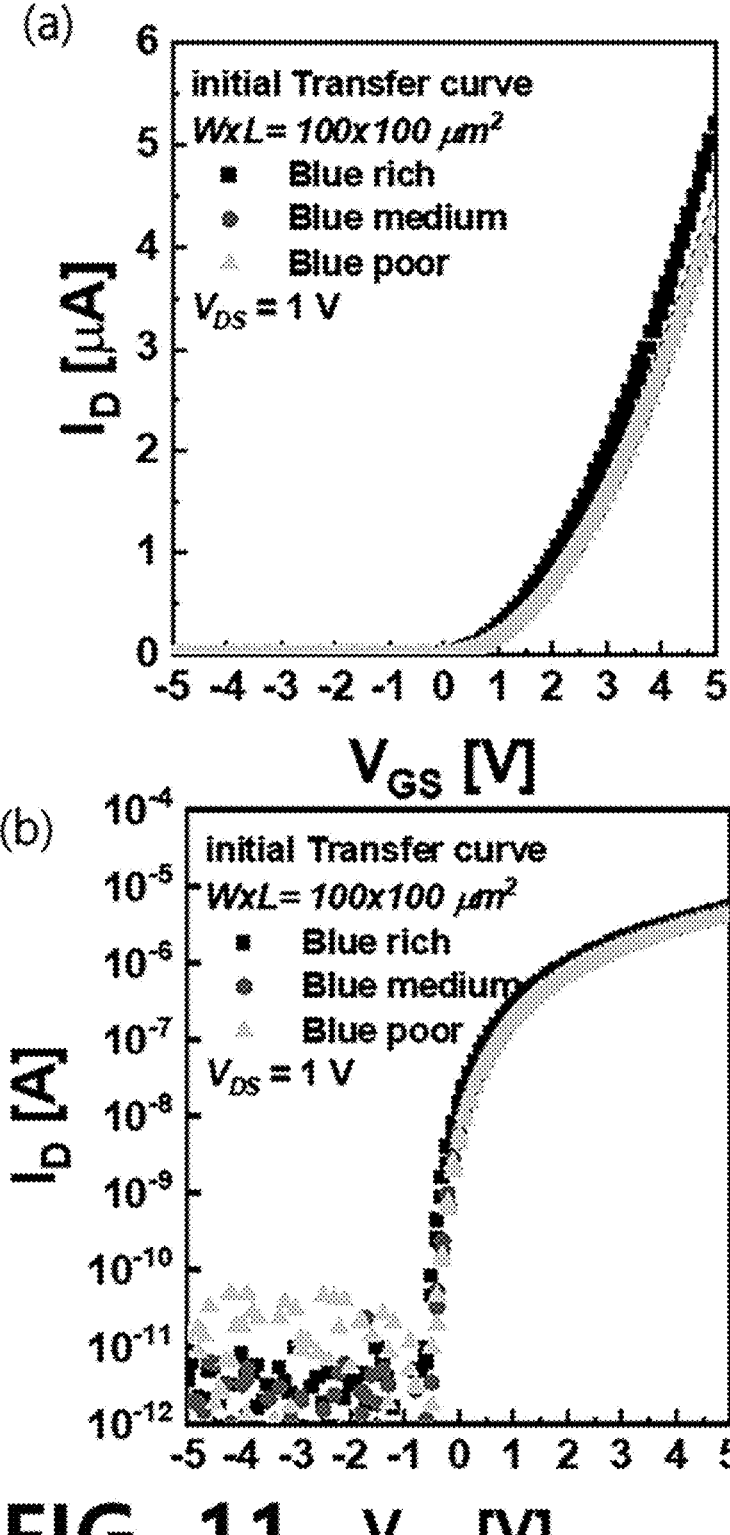
FIG. 11 shows characteristics between $V_{GS}$ and $I_D$ of the light transistor (1T) according to various light source types of LEDs.

FIG. 11 shows characteristics between $V_{GS}$ and $I_D$ of the light transistor (1T) according to various light source types of LEDs.

For the experiment, $V_GS$ was selected based on Dark current=100 pA and $V_{DS}$=1V. In addition, various types of light sources (Blue rich, Blue medium, Blue poor) of LED were selected according to the content of blue light (B) as follows.

Blue rich->(R100/G100/B100/A100)
Blue medium->(R100/G100/B50/A100)
Blue poor->(R100/G100/B20/A100)

In addition, the properties between $V_{GS}$ and $I_D$ of the light transistor (1T) according to each type of light source are shown in FIG. 11.

Figure 12:
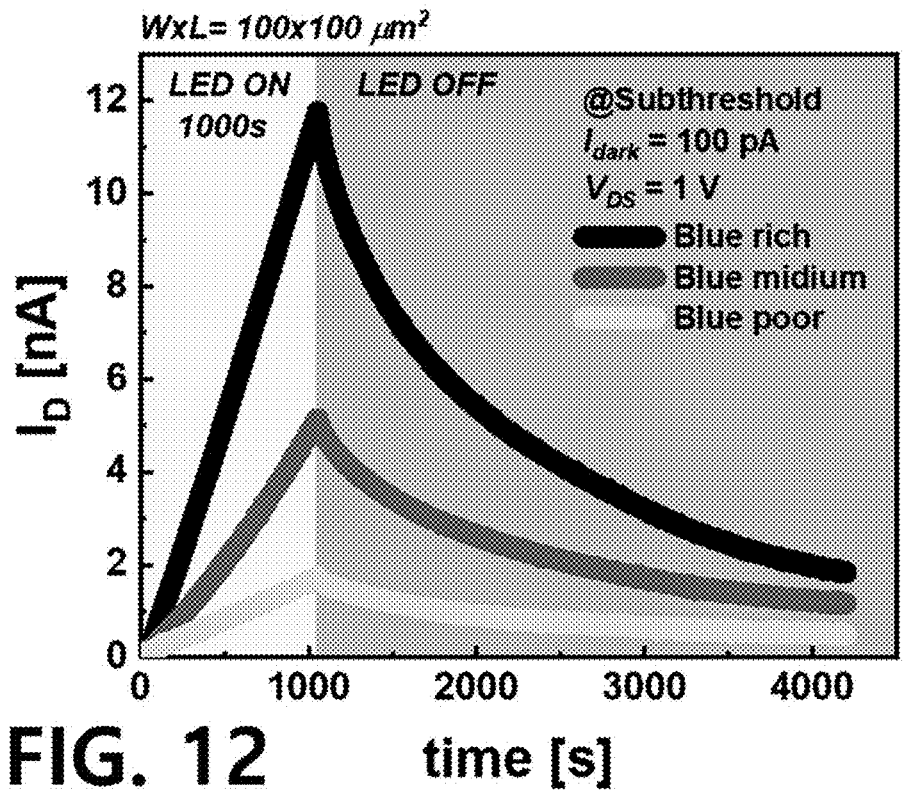
FIG. 12 shows characteristics between $V_{GS}$ and $I_D$ of the light transistor (1T) according to each type of light source having a different blue light (B) content.
Figure 13:
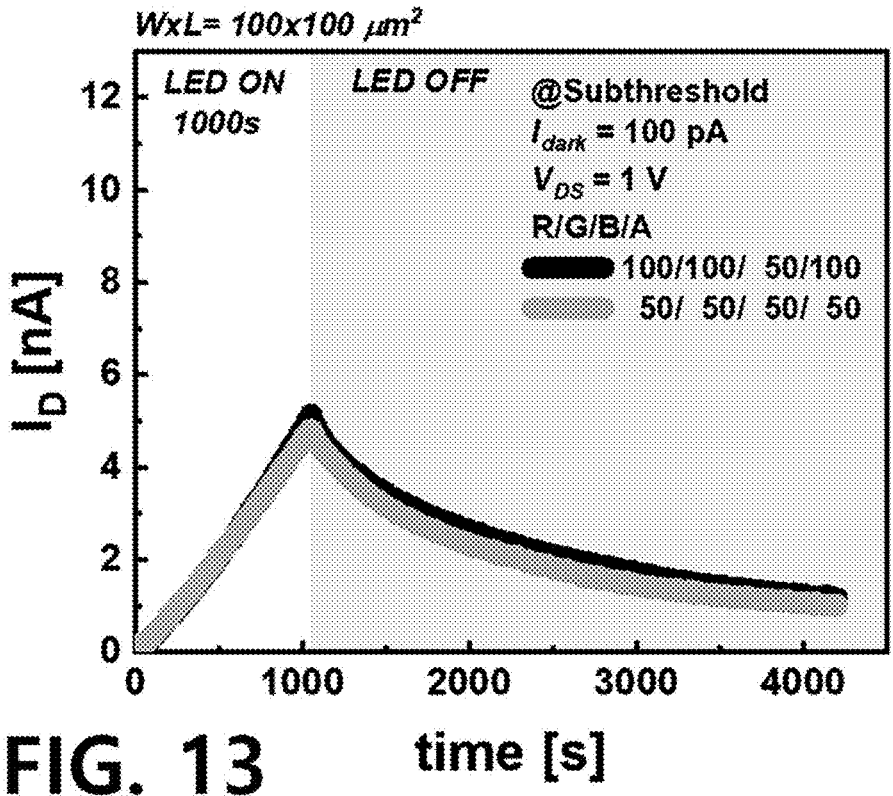
FIG. 13 shows characteristics between $V_{GS}$ and $I_D$ of the light transistor (1T) according to each type of light source having the same content of blue light B but different content of other color light sources.

FIG. 12 shows characteristics between $V_{GS}$ and $I_D$ of the light transistor (1T) according to each type of light source having a different blue light (B) content, and FIG. 13 shows characteristics between $V_{GS}$ and $I_D$ of the light transistor (1T) according to each type of light source having the same content of blue light B but different content of other color light sources.

The photoresponsivity of the light transistor (1T) was measured according to various types of light sources. As a result, as illustrated in FIGS. 12 and 13, when the LED is 'ON', it can be confirmed that the light transistor (1T) has the photoresponsivity of a linear characteristic of $I_D$ accord-ing to the application time of incident light. In this case, it can be seen that the photoresponsivity and Persistent Pho-toconductivity (PPC) effect of the light transistor (1T) are highly dependent on the content of blue light (B). In this case, the PPC effect refers to photoconductivity that does not disappear even after the light is turned off when light is applied to the light transistor (1T) and a photoreaction occurs (photocurrent rises). That is, it can be seen that the light transistor (1T) has a very high photoresponsivity to blue light (B) and a very small photoresponsivity to red light (R), green light (G) and daylight color light (A), except for blue light (B).

Figure 16:
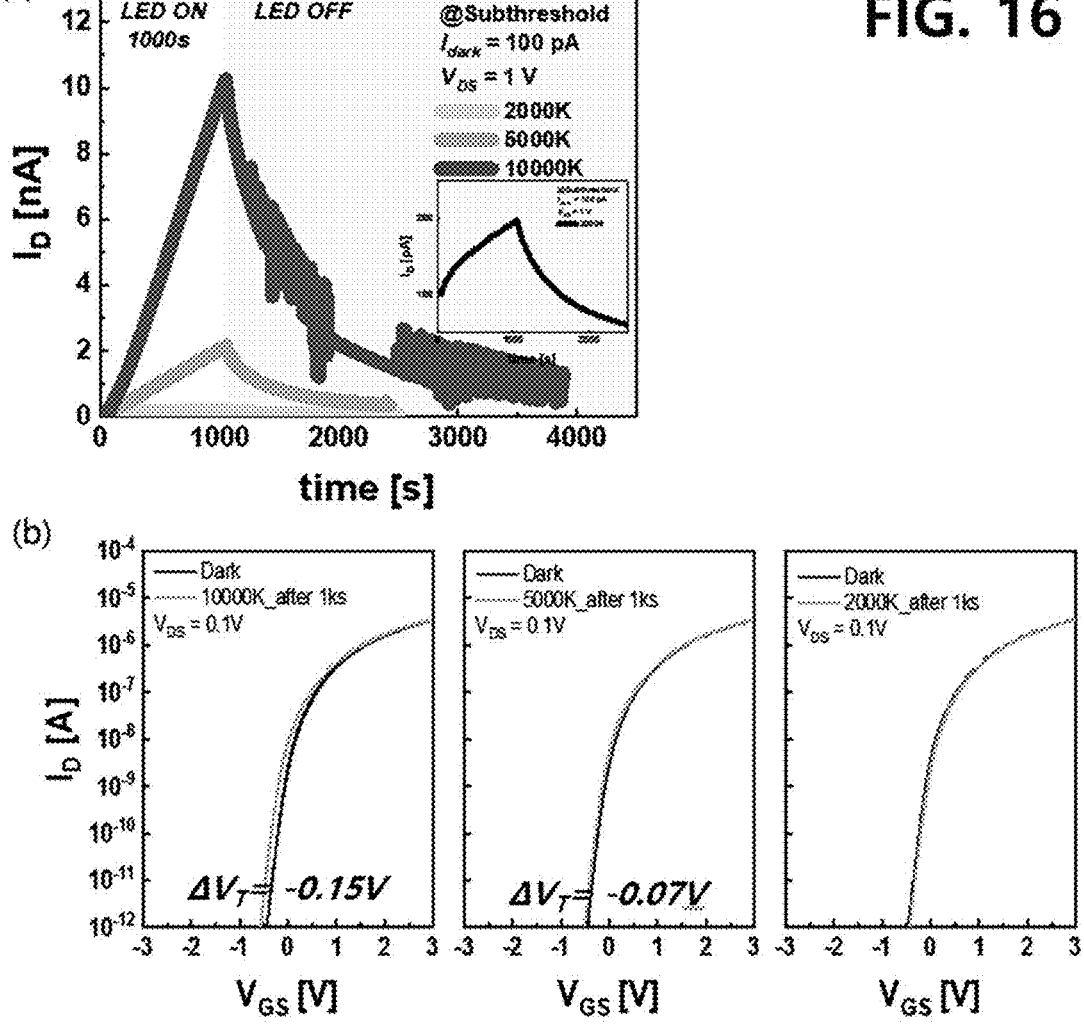
FIG. 16 shows characteristics between $V_{GS}$ and $I_D$ of the light transistor (1T) according to each type of light source having a different color temperature.

FIGS. 14 and 15 show information about light sources having various color temperatures that are controlled and output from LEDs. FIG. 16 shows characteristics between $V_{GS}$ and $I_D$ of the light transistor (1T) according to each type of light source having a different color temperature, and FIG. 17 shows a graph related to the photoresponsivity of the light transistor (1T) with respect to a light source having an illuminance of 10,000 lux and a color temperature of 10,000K, and FIG. 18 is an enlarged view of FIG. 17(*b*).

Figure 18:
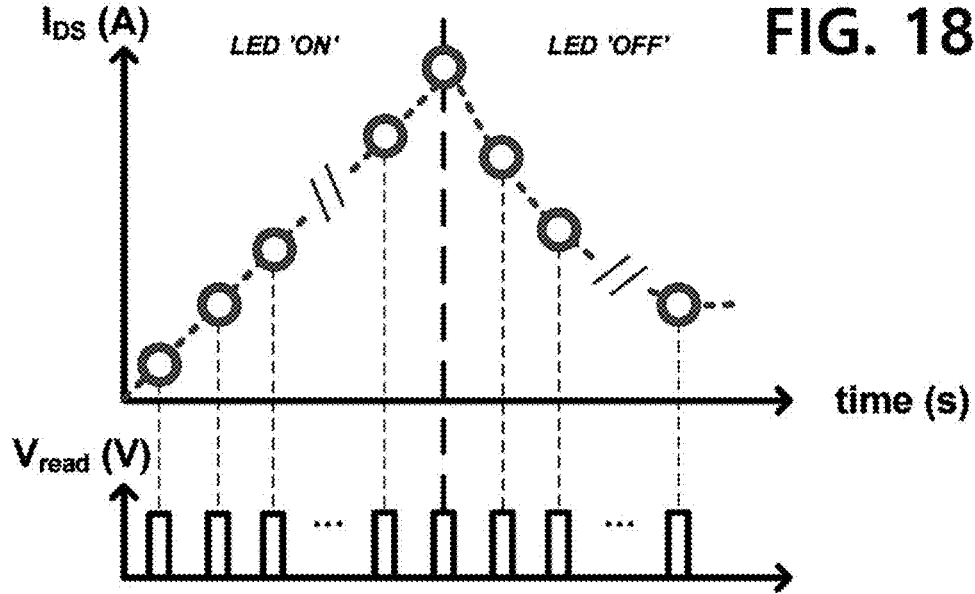
FIG. 18 is an enlarged view of FIG. 17(b).

As illustrated in FIGS. 14 and 15, while adjusting the color temperature (2,000K, 5,000K, 10,000K, etc.) of a light source (incident light) output from the LED variously and additionally adjusting the illuminance variously, the photo-responsivity of the light transistor (1T) at the corresponding color temperature and illuminance was measured, and the results are shown in FIGS. 16 to 18.

Next, an experiment was performed on the photorespon-sivity of the light transistor (1T) according to an increase in the illuminance of blue light.

That is, when the number of photons increases (i.e., the illuminance increases) in a light source having the same blue wavelength (440 nm), this is an experiment to check whether the photoresponsivity of the light transistor (1T) according to the corresponding increase in illuminance has linearity.

FIG. 19 is a graph of the photoresponsivity of the light transistor (1T) according to an increase in the illuminance of blue light.

Referring to FIG. 19, it can be seen that the photorespon-sivity of the light transistor (1T) changes linearly as the number of photons of blue light increases (i.e., as the illuminance increases).

For reference, in FIG. 19(*b*), the value of tau is a value applied to a stretched exponential function (SEF) in a normalized recovery state based on $I_{D,Max}$. According to the above, it was confirmed that the tau value according to an increase in the number of photons did not change signifi-cantly compared to the wavelength.

Next, an experiment was performed on the photoresponsivity of the light transistor (1T) according to an increase in the illuminance of the 10,000K color temperature light source.

That is, when the number of photons increases (i.e., the illuminance increases) in a light source having the same 10,000K color temperature, this experiment is performed to determine whether the photoresponsivity of the light transistor (1T) has linearity according to the corresponding increase in illuminance.

Figure 20:
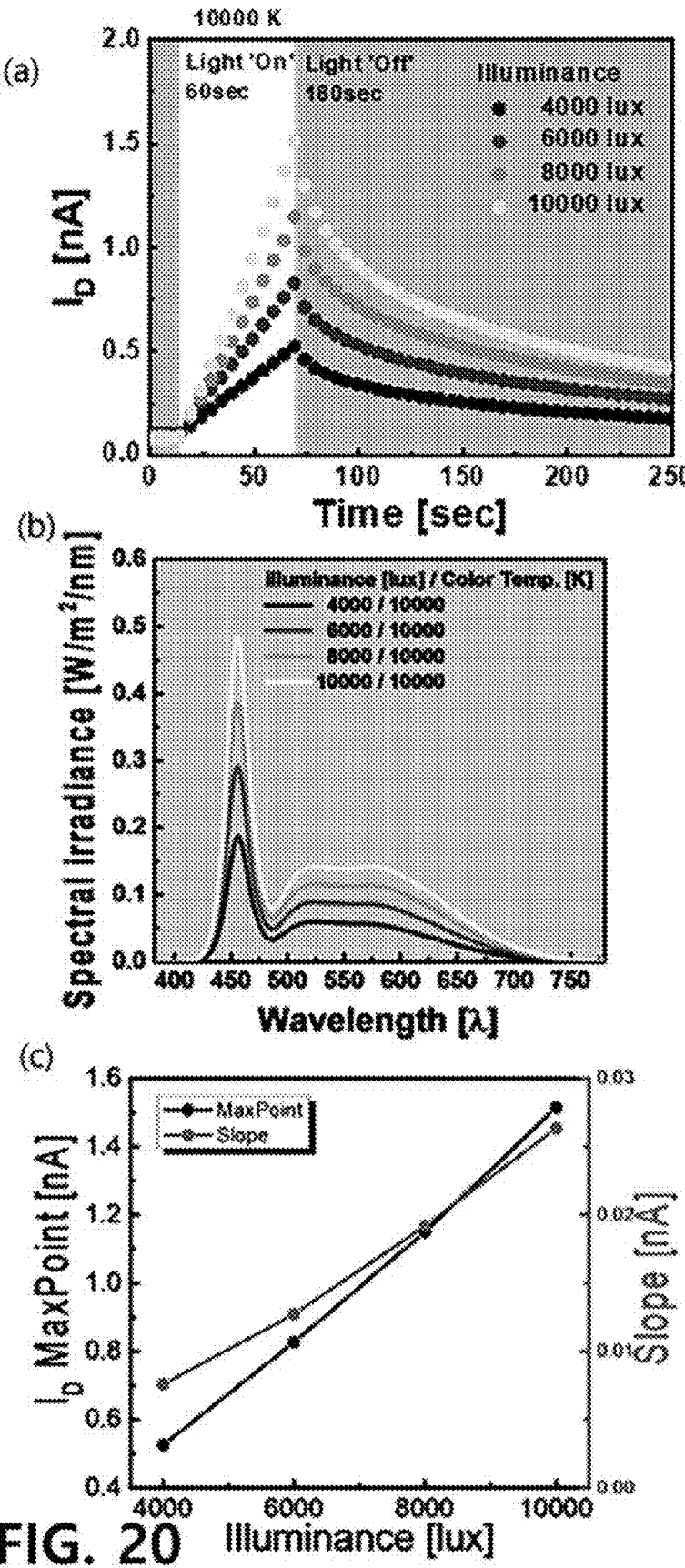
FIG. 20 shows a graph of the photoresponsivity of the light transistor (1T) according to an increase in illuminance of a light source with a color temperature of 10,000K.

FIG. 20 shows a graph of the photoresponsivity of the light transistor (1T) according to an increase in illuminance of a light source with a color temperature of 10,000K.

Referring to FIG. 20, it can be seen that the photoresponsivity of the light transistor (1T) changes linearly as the number of photons of the 10,000K color temperature light source increases (i.e., as the illuminance increases).

That is, as illustrated in FIGS. 19 and 20, the photoresponsivity of the light transistor (1T) has a correlation with the illuminance of the light source, and particularly, it was confirmed that the light sources of complex wavelengths as well as the light sources of blue wavelength have linearity with respect to illuminance. Accordingly, it can be seen that, when using the light transistor (1T), it is possible to classify (identify) the illuminance of the light source according to the type of linear change.

Next, an experiment was performed on the photoresponsivity of the light transistor (1T) to red light (R), green light (G) and blue light (B).

Figure 21:
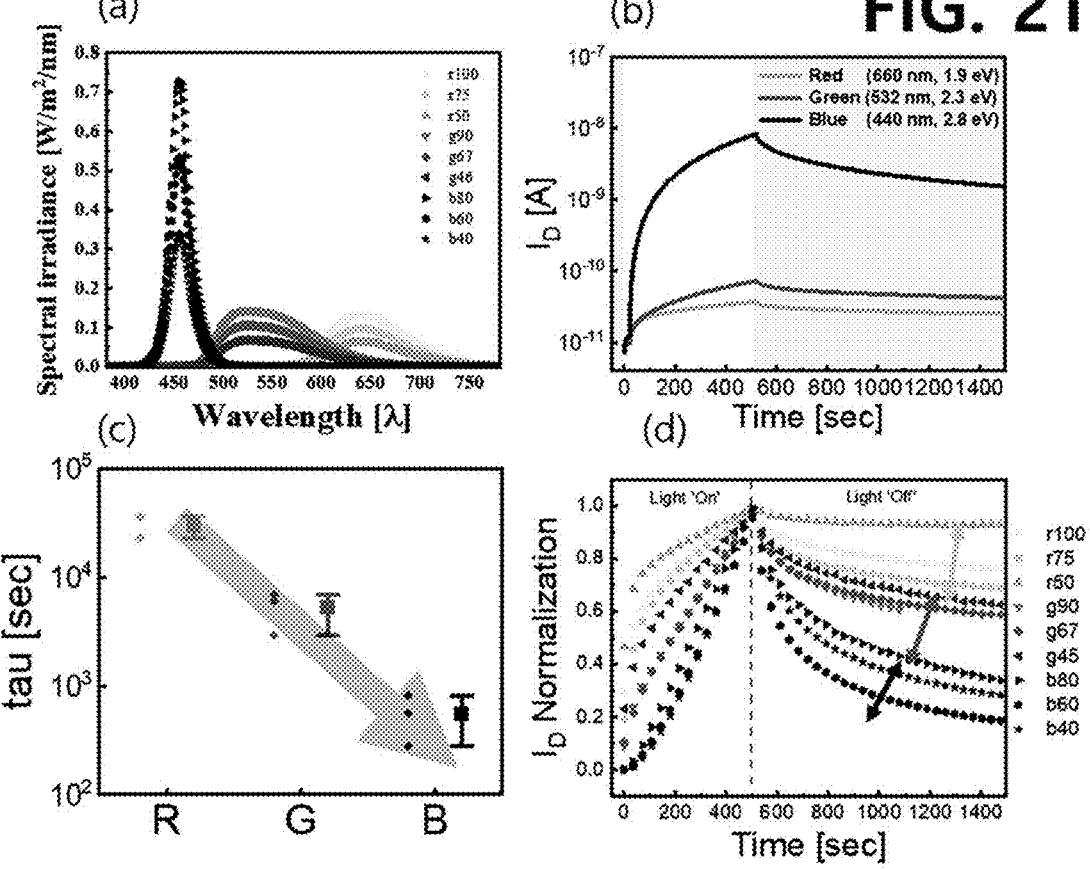
FIG. 21 shows a graph of the photoresponsivity of the light transistor (1T) to red light (R), green light (G) and blue light (B).

FIG. 21 shows a graph of the photoresponsivity of the light transistor (1T) to red light (R), green light (G) and blue light (B). In FIG. 21(d), '$I_D$ Normalization' indicates normalized $I_D$.

Referring to FIG. 21, it can be seen that as the wavelength is shorter, the photoresponsivity (R<G<B) is greater, and as the wavelength during recovery is shorter, the tau value (B≤G<R) becomes smaller. That is, as the wavelength is shorter, the recovery speed is faster, and as the wavelength is longer, the recovery speed becomes slower.

That is, when the light transistor (1T) is used, it is possible to classify (identify) the color temperature according to wavelength components such as red light (R), green light (G) and blue light (B) of the light source by classifying the type of recovery characteristics according to wavelength.

Next, an experiment was performed on the photoresponsivity of the light transistor (1T) with respect to the light sources of various color temperatures.

Figure 22:
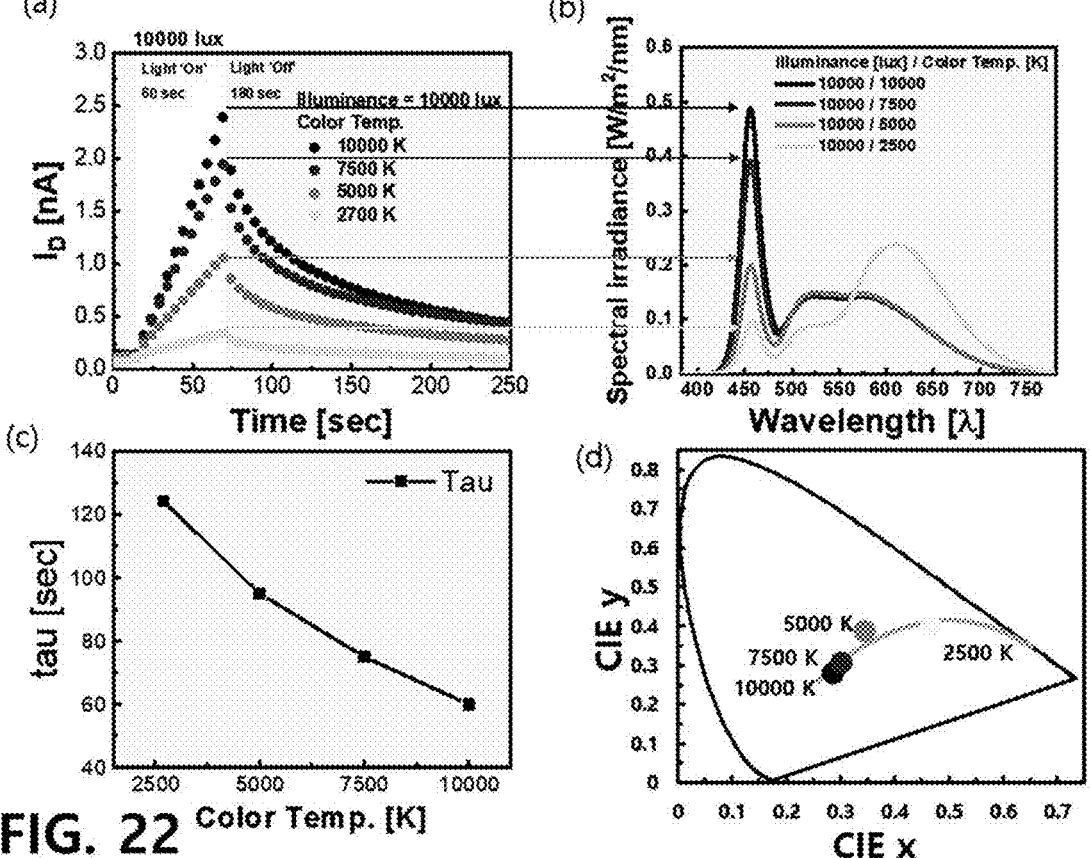
FIG. 22 shows a graph of the photoresponsivity of the light transistor (1T) to light sources of various color temperatures.

FIG. 22 shows a graph of the photoresponsivity of the light transistor (1T) to light sources of various color temperatures.

Meanwhile, the color temperature represents the color of the light source as a number by using an absolute temperature. As the color temperature is higher, the blue color is more dominant, and as the color temperature is lower, the red color is more dominant. Referring to FIG. 22, the light transistor (1T) having the channel material layer 115 of IGZO has the highest photoresponsivity with respect to a blue wavelength. That is, it exhibits high photoresponsivity for a light source in which the blue component is dominant.

Figure 23:
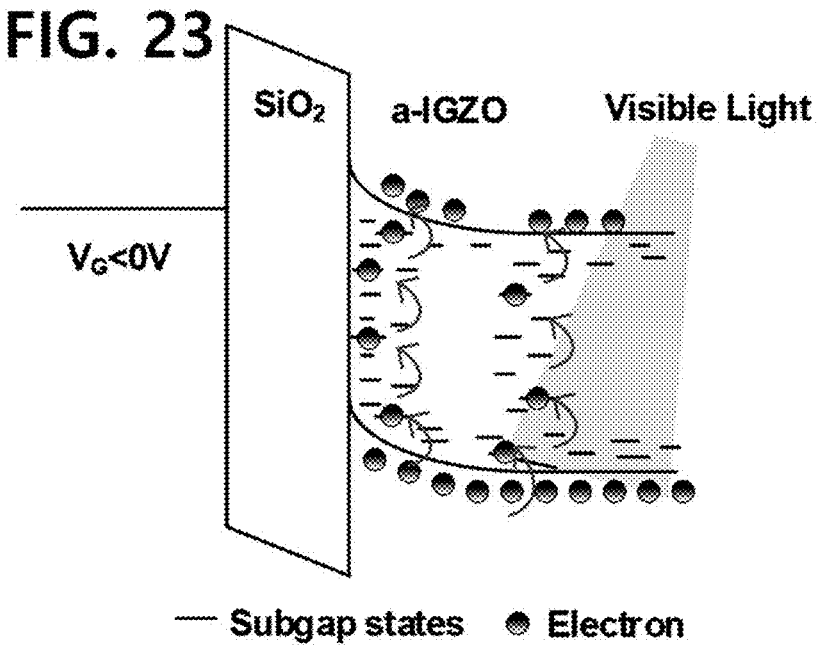
FIG. 23 shows the characteristics of IGZO for visible light.

FIG. 23 shows the characteristics of IGZO for visible light.

Meanwhile, IGZO is difficult to use as a visible light sensor because the energy band gap thereof is generally greater than 3 eV. However, as illustrated in FIG. 23, defects exist in the sub-gap due to the nature of the oxide semiconductor of IGZO, and trap-emission continuously occurs through the sub-gap state by visible light in the valence band, thereby contributing to the photocurrent. In addition, the recovery characteristics of tau in the dark state can be explained by the recovery of photo-induced electrons through the sub-cap state.

Figure 24:
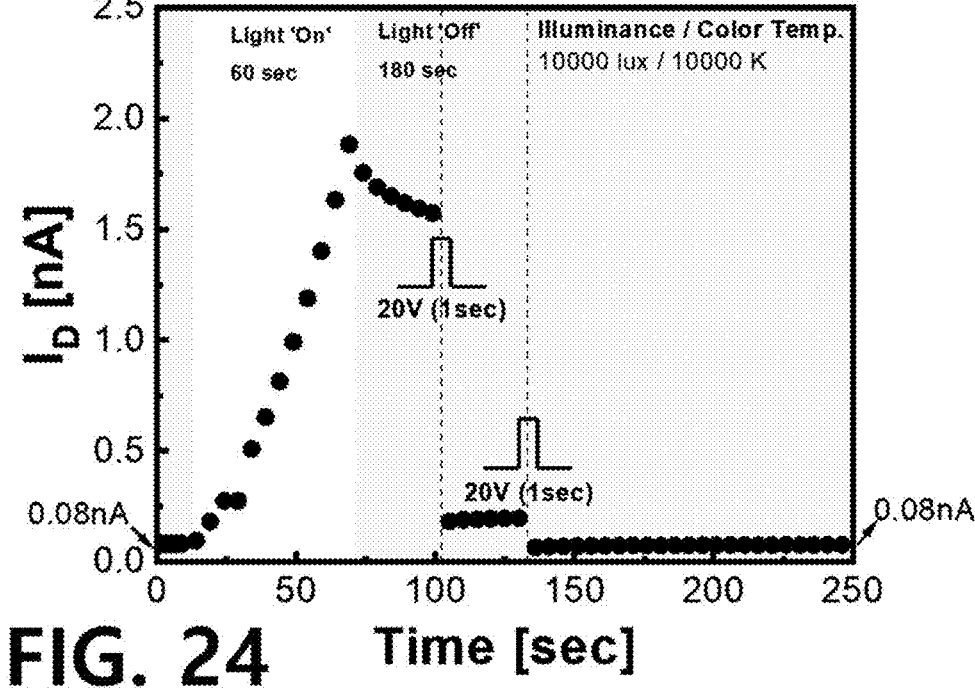
FIG. 24 shows a graph of the application of a pulse to reset a recovery state.

FIG. 24 shows a graph of the application of a pulse to reset a recovery state. Meanwhile, after going through a state in which the current (I D) and the conductance (G T) of the light transistor (1T) increase and recover, it is necessary to reset the light transistor 1T. Accordingly, as shown in FIG. 24, in order to reset the PPC component, a gate voltage of V G=20 V was applied twice for 1 second. As a result, it can be confirmed that the light transistor (1T) is reset according to the application of the corresponding gate voltage at the recovery time.

Next, an experiment was performed to measure the characteristics of the (1T1R) as each of the three light sources (R, G, B) was applied to the transistor and memristor device (1T1R).

Figure 25:
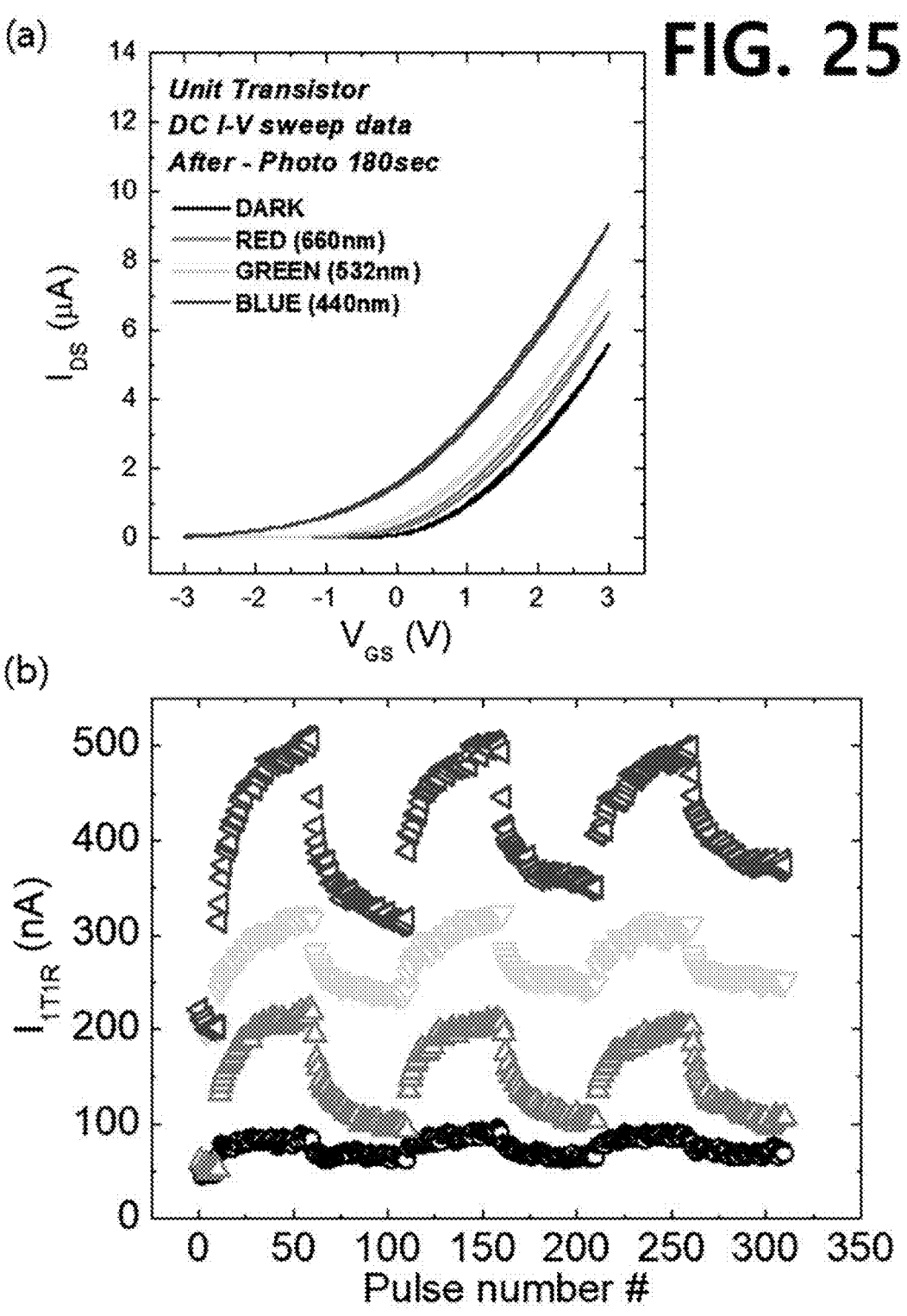
FIG. 25 shows a characteristic graph of the device (1T1R) of a transistor and memristor device according to the application of each light source (R, G, B).

FIG. 25 shows a characteristic graph of the device (1T1R) of a transistor and memristor device according to the application of each light source (R, G, B). However, in FIG. 25, 'DARK' refers to a case in which no light source is applied. That is, FIG. 25(a) shows the relationship between $V_{GS}$ and $I_D$S in the device (1T1R) according to each light source (R, G, and B), and FIG. 25(b) shows a change in current (I1T1R) flowing through the device (1T1R) according to the application of the programming pulse ($V_{pulse}$) with respect to each light source (R, G, B).

Referring to FIG. 25(a), even if the same $V_{GS}$ is applied to the device (1T1R), more $I_D$S flows as the wavelength of the light source becomes shorter. In addition, referring to FIG. 25(b), when such a device (1T1R) is used, depending on the application of $V_{pulse}$, the change pattern of I1T1$_R$ (i.e., change pattern of conductance) changes according to each wavelength (color temperature) of red light (R), green light (G) and blue light (B), and thus, it can be seen that it is possible to classify (identify) the same.

Figure 26:
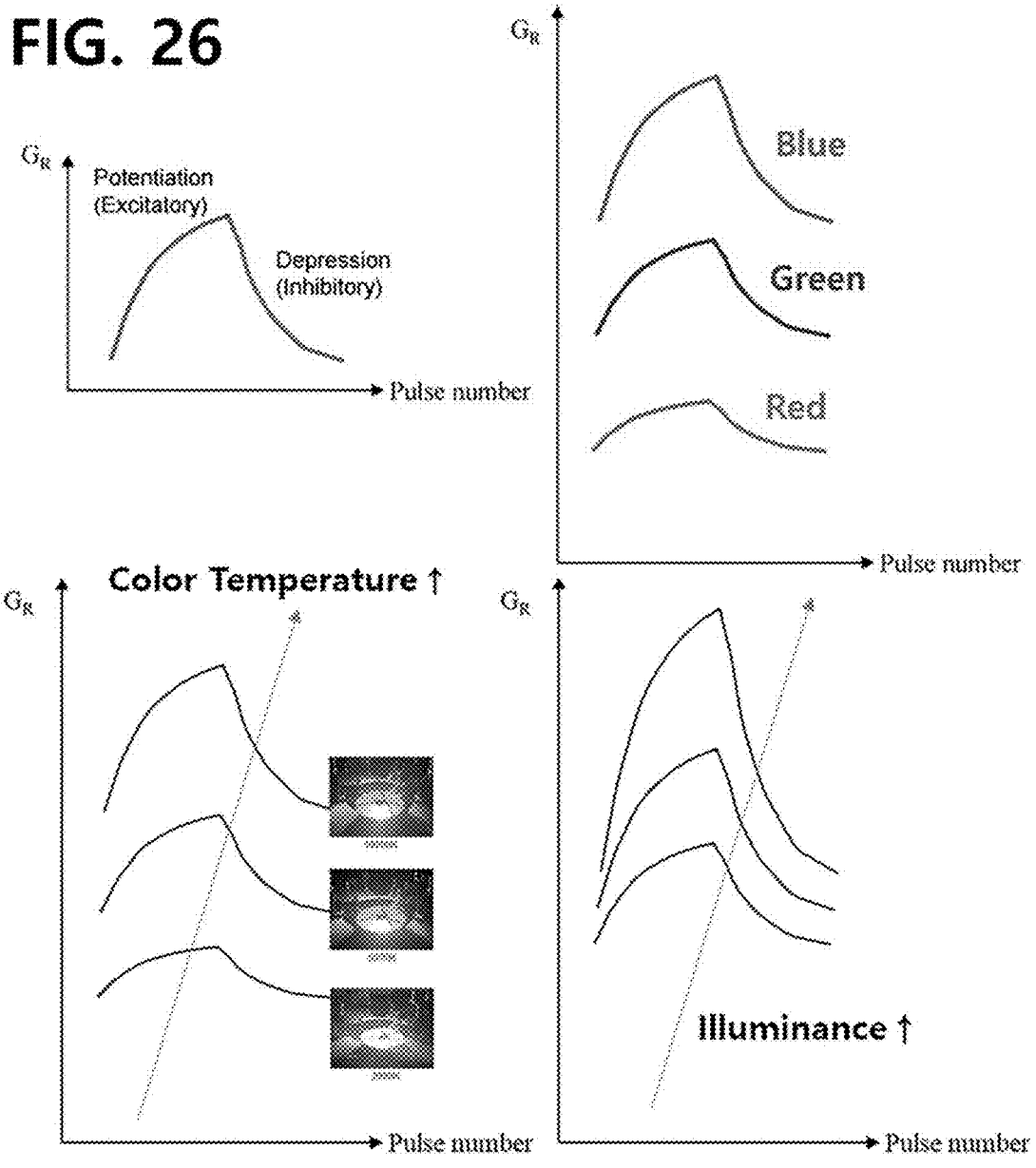
FIGS. 26 and 27 show graphs summarizing the results of the experiments.
Figure 27:
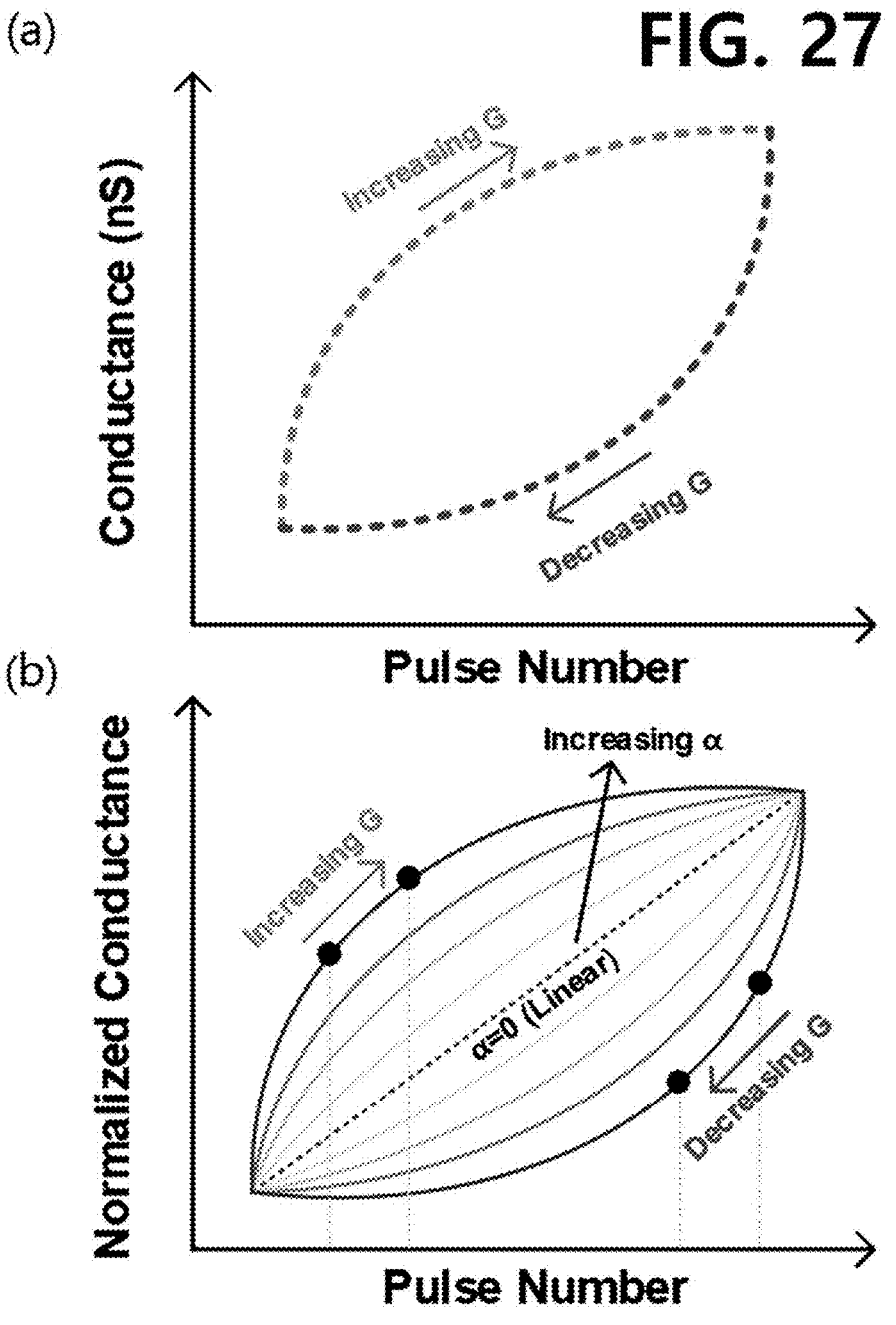

FIGS. 26 and 27 show graphs summarizing the results of the experiments.

The operation of the characteristic synapse according to the above-described experimental results is summarized as shown in FIGS. 26 and 27. That is, $G_R$ which is variably stored in the memristor device (1R) according to R/G/B of the light source or color temperature and illuminance has different initial values, increase/decrease rates according to programming pulse input, linearity and the like. Parameters related to $G_R$ can be expressed as shown (Formula 1) below.

$$G_+ = B\left(1 - e^{-\frac{P}{\alpha}}\right) + G_{min} \qquad \text{[Formula 1]}$$

$$G_- = -B\left(1 - e^{\frac{P-P_{max}}{\alpha}}\right) + G_{max}$$

$$B = (G_{max} - G_{min})/\left(1 - e^{-\frac{P_{max}}{\alpha}}\right)$$

Herein, P is the number of applied pulses, $G_+$ is a conductance change in the increasing direction, $G_-$ is a conductance change in the decreasing direction, $P_{max}$ is a maximum number of pulses required for the resistance of the resistance changing device (memristor) to change drastically to 0/1 (HRS/LRS), $\alpha$ is the coefficient reflecting the non-linearity of the conductance change (0 is linear), and B is the fitting parameter, respectively When the content according to FIGS. 19 to 27 is summarized, when the incident light has different optical properties at any one of the illuminance and color temperature (i.e., the optical properties having different color temperatures even if the illuminance is the same, or the optical properties having different illuminance even if the color temperature is the same), it can be seen that the change in the current ($I_D$) of the light transistor (1T) over time is different.

This indicates that the rate of change per time of the conductance ($G_T$) of the light transistor (1T) is a function of color temperature and illuminance, that is, f(CCT, lux). In this case, the initial dark current and bias current may be optimized by $V_G$.

In addition, it can be seen that when the light source is turned off, the rate of change per time of the recovered current ($I_D$) of the light transistor (1T) is also a function of the color temperature and the illuminance.

Therefore, if information on the rise of current ($I_D$) according to application to the light source (speed, etc.) and information on the decrease of current ($I_D$) according to light source removal (or electrical RESET) (speed, etc.) are paired, it will be possible to independently distinguish information on color temperature and illuminance.

<Operation of 1T1R>

Figure 28:
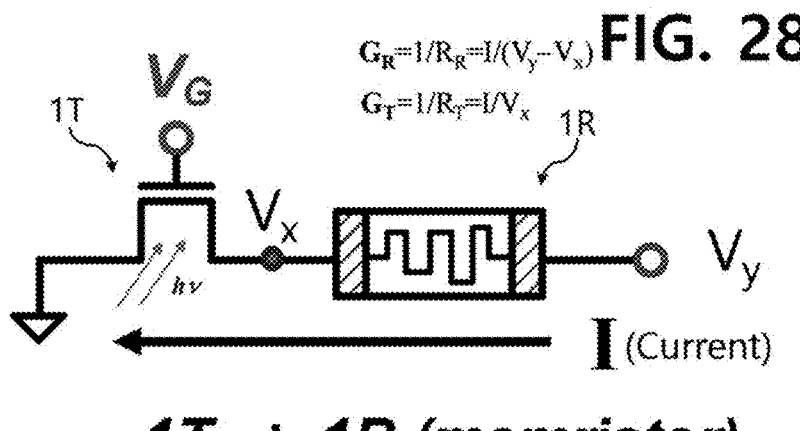
FIG. 28 shows a device (1T1R) fabricated based on the structure illustrated in FIG. 3.
Figure 29:
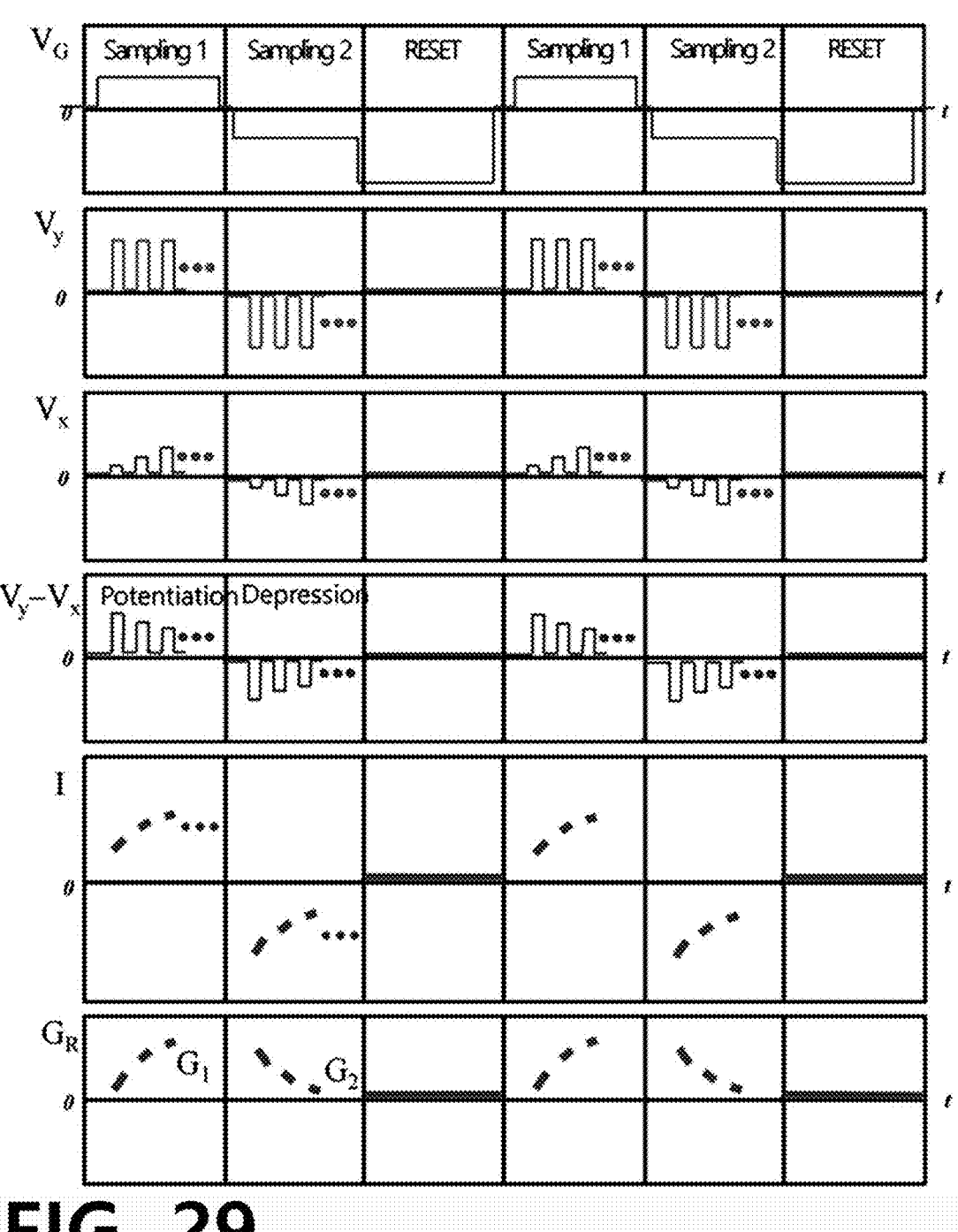
FIG. 29 shows an operation timing graph applied to the device (1T1R) of FIG. 26.

FIG. 28 shows a device (1T1R) fabricated based on the structure illustrated in FIG. 3, and FIG. 29 shows an operation timing graph applied to the device (1T1R) of FIG. 26.

In order to reflect the above-described experimental details for the device (1T1R) of the light transistor (1T) and the memristor (1R) of FIG. 28, as illustrated in FIG. 29, three operation processes of a first sampling process (sampling 1), a second sampling process (sampling 2) and a reset process (RESET) were applied.

These three operation processes may be performed periodically or at a specific time point (e.g., once every 10 seconds) in order to measure the surrounding light environment, and may be repeated.

First of all, in the first sampling process, a potentiation pulse voltage of continuous positive voltage pulses is applied to the memristor device (1R). That is, a voltage is applied such that the voltage ($V_y$) of the second electrode 123 of the memristor device (1R) becomes the programming voltage of the potentiation pulse. At the same time, a gate voltage $V_G$ (e.g., positive voltage, etc.) for turning on the light transistor (1T) is applied to the gate electrode of the light transistor (1T). Accordingly, the first sampling process is a period in which the light transistor (1T) is turned on, and the effect of incident light on the light transistor (1T) is reflected.

That is, in the first sampling process, whenever a positive voltage ($V_y$) pulse is applied to the memristor device (1R), a positive voltage ($V_x$) is applied to the drain electrode of the light transistor (1T). In this case, $V_x$ is determined by $V_y$ and the conductance ratio of the memristor device (1R)/light transistor (1T), that is, $G_R/G_T$, such that current (I) flows through the light transistor (1T).

Depending on the color temperature and illuminance of the incident light, $G_T$ and current (I) increase as the $V_y$ pulse is repeated, and when the current (I) increase rate is faster than the $R_T$ decrease rate (or $G_T$ increase rate) according to the pulse repetition, $V_x$ automatically increases according to the pulse. In this case, '$V_y$–$V_x$', which is the voltage across the memristor device (1R), decreases in magnitude while maintaining a positive voltage according to the repetition of the $V_y$ pulse. In this case, the resistance ratio and the operating point voltage may be adjusted by the first power supply device 13 as necessary such that the $G_T$ change is not too rapid.

If the $G_T$ increase rate according to the $V_y$ pulse is faster than the current (I) increase rate, '$V_y$–$V_x$' will increase in magnitude while maintaining a positive voltage according to the repetition of the $V_y$ pulse. However, even in this case, there is only a difference in the linearity of synaptic characteristics.

Therefore, in the first sampling process, both ends of the memristor device (1R) gradually increase $G_R$ according to the $V_y$ pulse. (i.e., potentiation or excitatory synapse action). In addition, when the $V_y$ pulse is applied, the degree of how much the change in $G_T$ increases is stored as $G_R$ of the memristor device (1R) as a function of the color temperature and illuminance of the incident light, and this is f(CCT, lux), which means that it is possible to obtain multiple characteristic excitatory synapses.

In summary, in the first sampling process, $G_R$ which is variably stored in the memristor device (1R) is changed to gradually increase while reflecting the optical properties (color temperature and illuminance) of incident light according to application of the potentiation pulse of $V_y$.

Meanwhile, although not illustrated in FIG. 29, the information on the increasing $G_R$ variably stored in the memristor device (1R) according to the first sampling process may be derived by applying a reading mode voltage to the memristor device 1R. This reading mode voltage may be applied at the beginning, during or after the first sampling process.

Next, in the second sampling process, the voltage of a depression pulse of consecutive negative voltage pulses is applied to the memristor device (1R). That is, a voltage is applied such that the voltage $V_y$ of the second electrode 123 of the memristor device (1R) becomes the programming voltage of the depression pulse. At the same time, a gate voltage $V_G$ (e.g., a negative voltage, etc.) for turning off the light transistor (1T) is applied to the gate electrode of the light transistor (1T). Accordingly, the second sampling process is a period in which the light transistor (1T) is lightly turned off, and the effect of the incident light on the light transistor (1T) is reduced or blocked.

That is, in the second sampling process, since incident light is most perfectly blocked mechanically, a mechanical shutter may be added to the light transistor (1T) to block incident light. However, this is difficult to implement in reality. Accordingly, by adjusting the gate voltage ($V_G$) of the light transistor (1T) to turn off the light transistor (1T) weakly, it is possible to implement the light transistor (1T) to have almost no influence of current change due to incident light. Accordingly, in the second sampling process, the current (I) which increased in the first sampling process falls and is recovered.

Specifically, in the second sampling process, by applying a negative voltage $V_y$ pulse, a negative voltage having an absolute value smaller than $V_y$ is applied to $V_x$. In addition, $G_T$ decreases as $V_y$ pulses are continuously applied, and the absolute value of $V_x$ gradually increases as $G_T$ decreases.

Therefore, in the second sampling process, a negative voltage gradually decreasing in magnitude is applied to both ends of the memristor device (1R), and $G_R$ gradually decreases (depression or inhibitory synapse operation). In addition, the degree of how much the $G_T$ change is reduced when the $V_y$ pulse is applied is stored as $G_R$ of the memristor device (1R) as a function of the color temperature and illuminance of the incident light in the first sampling process, and this is f(CCT, lux), which means that it is possible to obtain multiple characteristic excitatory synapses.

In summary, in the second sampling process, $G_R$ which is variably stored in the memristor device (1R) is changed to gradually decrease while reflecting the optical properties (color temperature and illuminance) of incident light according to the application of the depression pulse of $V_y$.

Meanwhile, although not illustrated in FIG. 29, the information about the decreasing $G_R$ variably stored in the memristor device (1R) according to the second sampling process may be derived by applying a reading mode voltage to the memristor device (1R). This reading mode voltage may be applied at the beginning, during or after the second sampling process.

Next, in the reset process, a voltage for resetting the light transistor is applied to the gate electrode of the light transistor (1T). For example, by applying a large negative voltage to $V_G$ and tying $V_y$ to the ground (GND), the history of the light transistor (1T) that has sensed information about the incident light may be erased. and the light transistor (1T) may be returned to its initial state.

Through the first and second sampling processes, after the voltage of the potentiation pulse is applied to the memristor device (1R), the voltage of the depression pulse is applied, and through this, $G_R$, which changes by reflecting the optical properties of the incident light, is stored in the memristor element (1R). In addition, information on $G_R$ stored in this way may be derived through a voltage in the reading mode.

That is, when the incident light has optical properties of different color temperatures even though the illuminance is the same or has optical properties of different illuminance even if the color temperature is the same, the $G_R$ of the memristor device (1R), which changes according to the application of the $V_y$ pulse voltage, changes in different patterns.

For example, referring to FIGS. 21 and 26, each variable conductance ($G_{RR}$, $G_{RG}$, $G_{RB}$) of the memristor device (1R) for each incident light of red light, green light and blue light (where $G_{RR}$ is the conductance of red light, $G_R$G is the conductance of green light, and $G_R$B is the conductance of blue light) may have change patterns that are different from each other. That is, in the change patterns of $G_{RR}$, $G_{RG}$ and $G_{RB}$ according to the application of the voltage of the $V_y$ potentiation pulse (or depression pulse), the value of each start conductance, the value of each end conductance, and beach variation between the start conductance and the end conductance may be different from each other.

Particularly, in the case of a device (1T1R) implemented by using IGZO, photoresponsivity with respect to the incident light of blue light is the highest among the incident lights of red light, green light and blue light. Accordingly, $G_R$ which is variably stored in the memristor device (1R) according to the application of the voltage of the potentiation pulse has the largest start and end conductance values when the blue light is the incident light, compared to the case where the red light and the green light are the incident light, or the variation between the start conductance and the end conductance is the largest.

That is, $G_{RB}$ has the largest start and end conductance values, or the largest variation between the start conductance and the end conductance, compared to $G_{RR}$ and $G_{RG}$.

Various characteristics derived according to the above-described experiments may be characteristics that are applied to the device 10 according to an exemplary embodiment of the present invention.

Next, the system according to an exemplary embodiment of the present invention will be described.

FIG. 30 shows a block diagram of the system 200 according to an exemplary embodiment of the present invention.

The system 200 according to an exemplary embodiment of the present invention is a system using or including the device 10 described above, and it may be an electronic device which is capable of computing or a computing network.

That is, the system 200 may be a system using the variable conductance ($G_R$) stored in the device 10. For example, the system 200 may be a system which uses $G_R$ stored in the device 10 to determine (measure) the optical properties of incident light according to the surrounding light environment, determine bio-illuminance (circadian illuminance), or diagnose biorhythm (circadian rhythm).

For example, the system 200 may be a desktop personal computer (PC), a laptop personal computer (PC), a tablet personal computer (PC), a netbook computer, a workstation, a workstation, a personal digital assistant (PDA), a smartphone, a smartpad or a mobile phone, but the present invention is not limited thereto. That is, the system 200 may be a new system (device) for determining the optical properties of incident light, determining bio-illuminance (circadian illuminance) or diagnosing circadian rhythm.

Referring to FIG. 30, the system 200 includes a controller 210, a memory 220, a neuromorphic unit 230, and may further include an input unit 240, an output unit 250 and a communicator 260.

The controller 210 may generate and transmit various signals for learning by using the neuromorphic unit 230 and perform various processes and functions to recognize a pattern according to an output from the neuromorphic unit 230. In addition, the controller 210 is connected to the memory 220, the neuromorphic unit 230, the output unit 250 and the communicator 260 so as to control the operations thereof. For example, the controller 210 may include a processor which is hardware or a process which is software that is executed in the corresponding processor, but the present invention is not limited thereto.

The memory 220 may store various information necessary for the operation of the system 200. For example, the memory 220 may include a volatile memory device such as DRAM or SRAM, PRAM, MRAM, ReRAM, or a non-volatile memory such NAND flash memory, or a hard disk drive (HDD) or a solid state drive (SSD), but the present invention is not limited thereto. In addition, the memory 140 may be a cache, a buffer, a main memory or an auxiliary memory, or a separately provided storage system depending on the purpose/location thereof, but the present invention is not limited thereto.

The neuromorphic unit 230 includes the device 10. In this case, the device 10 stores the varied conductance ($G_R$) according to the optical properties of the color temperature and illuminance of the incident light. In particular, under the control of the controller 210, the neuromorphic unit 230 may perform learning according to a machine learning technique using $G_R$ stored in the device 10, and output data corresponding to the learned pattern (result information).

For example, the machine learning model learned according to a machine learning technique may be implemented through a neuromorphic device included in the neuromorphic unit 230.

In this case, the neuromorphic device is a device that processes information by simulating the human brain. For example, the neuromorphic device may include a plurality of pre-synaptic neurons and post-synaptic neurons and a synaptic array connecting these neurons. In this case, the synaptic array may have a structure in which a plurality of synaptic devices are electrically connected to an input circuit, an output circuit and a driver.

In particular, the synaptic array includes a plurality of arranged synapses. In this case, one synapse may include at least one synaptic device. That is, the synaptic array may include multiple synaptic devices. However, one synapse may consist of a plurality of synaptic devices.

The input circuit unit transmits a synaptic input signal, which is an electrical signal, to each synaptic device through a plurality of input lines. For example, such an input circuit may include a plurality of pre-synaptic neurons and a circuit electrically connecting the same, but the present invention is not limited thereto.

The output circuit unit receives a synaptic output signal, which is an electrical signal output from each synaptic device, through a plurality of output lines, and performs various signal processing according to the corresponding synaptic output signal. For example, this output circuit may include a plurality of post-synaptic neurons and a circuit electrically connecting the same, and each post-synaptic neuron may include an integrator, a comparator and the like, but the present invention is not limited thereto.

The driver transmits electrical signals for the synaptic action of the synaptic device to each synaptic device through multiple lines.

The machine learning model is learned by using learning data to express the relationship between input information and output information (result information) in multiple layers, and these multiple expression layers are referred to as "neural networks." Each layer in the neural network is composed of at least one filter, and each filter has a matrix of weights. That is, each element (pixel) in the matrix of the corresponding filter may correspond to a weight value.

For example, the machine learning technique is a supervised learning technique, such as Artificial neural network, Boosting, Bayesian statistics, Decision tree, Gaussian process regression, Nearest neighbor algorithm, Support vector machine, Random forests, Symbolic machine learning, Ensembles of classifiers or deep learning, but the present invention is not limited thereto. In addition, the deep learning technique may include Deep Neural Network (DNN), Convolutional Neural Network (CNN), Recurrent Neural Network (RNN), Restricted Boltzmann Machine (RBM), Deep Belief Network (DBN) or Deep Q-Networks, but the present invention is not limited thereto.

That is, the learning data includes input information and output information (result information) as one set. In this case, the input information of the learning data includes $G_R$ stored in the device 10. Such $G_R$ may be derived by applying a voltage signal in the reading mode to the variable resistance memory device 12 of the device 10. In particular, as illustrated in FIG. 33, $G_R$ included in the input information may include information on the first variable conductance $G_1$ according to a potentiation pulse and information on the second variable conductance $G_2$ according to a depression pulse. These $G_1$ and $G_2$ reflect the optical properties of color temperature and illuminance of incident light.

In addition, the output information of the learning data may include information related to the optical properties (color temperature and illuminance) of incident light, bio-illuminance (circadian illuminance) or biological rhythm (circadian rhythm).

For example, the machine learning model (hereinafter, referred to as a "first machine learning model") may be learned based on learning data in which output information includes information on optical properties of incident light. In this case, the first machine learning model is trained to match a functional relationship between input information on $G_1$ and G2 and output information on the optical properties (color temperature and illuminance) of incident light in a surrounding light environment. In this case, the output information of the learning data includes the measured color temperature value and illuminance value of the incident light.

When the first machine learning model is used, it is possible to easily know the color temperature and illuminance of the current ambient light environment. That is, by performing the first and second sampling processes on the device 10 (certainly, the reset process is also performed after the second sampling process), the information for $G_1$ and G2 according to the current ambient light environment stored in the device 10 is derived. Thereafter, by inputting the derived $G_1$ and G2 to the pre-learned first machine learning model, the first machine learning model may output the color temperature and illuminance of the current ambient light environment.

In addition, the machine learning model (hereinafter, referred to as a "second machine learning model") may be learned based on learning data in which output information includes information on circadian illuminance according to the optical properties of incident light. In this case, the second machine learning model is trained to match the functional relationship between the input information for $G_1$ and $G_2$ and the output information for the circadian illuminance according to the optical properties (color temperature and illuminance) of the incident light in the surrounding light environment. In this case, the output information of the learning data includes the measured or calculated circadian illuminance value based on the actually measured color temperature value and illuminance value of the incident light.

For example, if the wavelength spectrum of the light source is determined, the Circadian Action Factor (CAF) value may be calculated through the ratio between the visual efficiency of the light source determined by the visual sensitivity curve (Luminous Efficacy of Radiation; LER) and the circadian efficiency of the light source determined by the circadian sensitivity curve (Circadian Efficacy of Radiation; CER).

In this case, LER may be obtained by using (Formula 2) below.

$$K = K_0 \int_{380nm}^{780nm} V(\lambda)S(\lambda)d\lambda / \int_0^\infty S(\lambda)d\lambda \qquad \text{[Formula 2]}$$

Herein, $V(\lambda)$ is a luminous efficiency function, and $\lambda_{max}$ may be 555 nm. In addition, $S(\lambda)$ is a radiant flux, $K_0$ is a maximum value of the spectral luminous efficacy for photopic vision, and may be 683 lm/W.

Meanwhile, CER 0 ms may be obtained by using (Formula 3) below.

$$K_c = K_{c0} \int_{380nm}^{780nm} C(\lambda)S(\lambda)d\lambda / \int_0^\infty S(\lambda)d\lambda \qquad \text{[Formula 3]}$$

Herein, $C(\lambda)$ is a Circadian efficiency function, and $\lambda_{max}$ may be 460 nm. In addition, $S(\lambda)$ is radiant flux, and $K_{c0}$ is a maximum value of the circadian luminous efficacy for non-vision, and may be 685 lm/W.

By multiplying the CAF by the illuminance, the bio-illuminance value (Circadian illuminance; CIL) may be calculated as shown in Formula (4) below.

$$CIL(blm/m^2) =$$
$$CAF(blm/lm) \times VIL(lm/m^2) = [CER(blm)/LER(lm)] \times VIL(lm/m^2)$$

When the second machine learning model is used, the circadian illuminance of the current ambient light environment may be easily obtained. That is, by performing the first and second sampling processes on the device 10 (certainly, the reset process is also performed after the second sampling process), the information for $G_1$ and G2 according to the current ambient light environment stored in the device 10 is derived. Thereafter, by inputting the derived $G_1$ and G2 to the pre-learned second machine learning model, the second machine learning model may output the circadian illuminance for the current ambient light environment.

In addition, the machine learning model (hereinafter, referred to as a "third machine learning model") may be trained based on learning data in which output information includes information about a circadian rhythm according to the optical properties of incident light. In this case, the third machine learning model is learned to match the functional relationship between the input information for $G_1$ and $G_2$ and the output information for the circadian rhythm according to the optical properties (color temperature and illuminance) of the incident light in the surrounding light environment. In this case, the output information of the learning data includes information on the measured or calculated circadian rhythm based on the measured color temperature value and illuminance value of the incident light or the measured or calculated circadian illuminance value.

For example, information about circadian rhythm included as output information of learning data may include melatonin suppression value (MSV) information, information on the time when melatonin secretion starts and reaches the peak, information on the time when core body temperature reaches the lowest point, heart rate information (heart rate minimum reached time, etc.), electrocardiogram information, activity information, brain wave information and the like, but the present invention is not limited thereto.

In this case, the MSV may be experimentally derived through a clinical experiment for measuring the amount of melatonin secretion for each illuminance under the condition of a light source having a specific light spectrum. In particular, if the amount of suppression of melatonin secretion is plotted by converting the illuminance to a bio-illuminance scale, it is possible to obtain a universal curve regardless of the type of light source.

In addition, on a 24-hour basis, the time when melatonin secretion reaches its maximum and the DLMO (Dim Light Melatonin Onset) time when secretion begins (e.g., the point where melatonin secretion reaches 25% of the peak secretion) may be used as the information for circadian rhythm. Human core body temperature (CBT) also shows a circadian rhythm, and the time when the core body temperature reaches its minimum is one of the important information about the circadian rhythm. For reference, after 1 to 2 hours following the time when melatonin secretion reaches its maximum, the core body temperature becomes its minimum.

Meanwhile, the time of the maximum of melatonin secretion and the minimum of core body temperature are associated with electrocardiogram information or heart rate information. That is, the time at which the RR interval time, which is an average of the times between the R peak of the electrocardiogram and the next R peak, reaches its peak almost coincides with the time of the maximum of melatonin secretion. In addition, the time at which the heart rate is the lowest almost coincides with the time at which the core body temperature is at the minimum. Accordingly, from heart rate information or electrocardiogram information measured by using a wearable device or the like, it is possible to infer the time of the maximum of melatonin secretion and the minimum of core body temperature, which are one of the main indicators of circadian rhythm.

In addition, activity data acquired from a wearable device (smart watch, etc.) worn on the wrist may be converted into IS (interdaily stability) and IV (intradaily variability) indicators. Since these indices provide information on how regular the daily circadian rhythm is and how much the circadian rhythm changes within a day, they may be useful information on the circadian rhythm.

When the third machine learning model is used, the user's circadian rhythm according to the current ambient light environment may be easily known. That is, by performing the first and second sampling processes on the device 10 (certainly, the reset process is also performed after the second sampling process), information for $G_1$ and $G_2$ according to the current ambient light environment stored in the device 10 is derived. Thereafter, by inputting the derived $G_1$ and $G_2$ to the pre-learned third machine learning model, the third machine learning model may output diagnostic information about the user's circadian rhythm according to the current ambient light environment.

In summary, the machine learning model is a pre-trained model to output result information related to the optical properties of the incident light, circadian illuminance or circadian rhythm, from the input information on the variable conductance ($G_R$) of the device 10 in which the optical properties of the incident light are reflected. Accordingly, the controller 210 may input the input information about the variable conductance ($G_R$) stored in the device 10 to the pre-learned machine learning model, so as to control the corresponding result information to be output.

In particular, the machine learning model may be implemented through hardware having a dedicated electronic circuit or implemented through software. For example, when it is implemented through hardware, the neuromorphic unit 230 may include various electronic circuits that are necessary for the machine learning model in addition to the device 10. In addition, when it is implemented through software or hardware, the machine learning model may be stored as storage information in the memory 220. In this case, by using the information about the machine learning model stored in the memory 220 and information for the variable conductance ($G_R$) stored in the device 10 of the neuromorphic unit 230 through the first and second sampling processes, the controller 210 may obtain information related to the optical properties of incident light, circadian illuminance or circadian rhythm in the current ambient light environment.

Meanwhile, the input unit 240 generates input data in response to various user inputs, and may include various input means. For example, the input unit 240 may include a microphone, a camera, a scanner, a touch pad, a keyboard, a mouse, a mouse pen or at least one of various sensors, but the present invention is not limited thereto.

In addition, the output unit 250 may output data such as information about the variable conductance ($G_R$) stored in the device 10, information about the machine learning model and information about the result of performing the machine learning model in various ways. For example, the output unit 250 may include a speaker, a printer, a monitor, a display panel, a beam projector, a hologrammer or other various output devices, but the present invention is not limited thereto. In addition, when the output unit 250 includes a display panel, the corresponding display panel may be combined with the input unit 240 and implemented as a touch screen or the like.

In addition, the communicator 260 may transmit or receive various data to a communicator of another system through a network. For example, the communicator 260 may transmit/receive information about variable conductance (GR) stored in the device 10, information about a machine learning model, information about an execution result of a machine learning model and the like, to and from another system. For example, the communicator 260 may perform wireless communication such as $5^{th}$ generation communication (5G), long term evolution-advanced (LTE-A), long term evolution (LTE), Bluetooth, Bluetooth low energy (BLE), near-field communication (NFC), WiFi communication, or wired communication such as cable communication, but the present invention is not limited thereto.

The present invention configured as described above has the advantage of being able to vary resistance (variable conductance) according to the optical properties of color temperature and illuminance of an ambient light environment and store the variable values. In addition, the present invention has the advantages of being able to perform various applications simply and quickly, such as measuring values for color temperature and illuminance of an ambient light environment, measuring bio-illuminance that affects circadian rhythm, or self-diagnosing the corresponding circadian rhythm, by using the storage information of an optical property storage device.

In the detailed description of the present invention, specific exemplary embodiments have been described, but various modifications are possible without departing from the scope of the present invention. Therefore, the scope of the present invention is not limited to the described exemplary embodiments, and should be defined by the following claims and equivalents thereof.

INDUSTRIAL APPLICABILITY

The present invention relates to an optical property storage device and a system using the same, and since it can provide a device which is capable of varying resistance (variable conductance) according to the optical properties of color temperature and illuminance of an ambient light environment and storing the variable resistance, and a system using the corresponding device, it has industrial applicability.

The invention claimed is:

1. A device, comprising:

a light transistor in which a conductance between a source electrode and a drain electrode changes in accordance with optical properties of color temperature and illumination of incident light; and a variable resistance memory device of two terminals in which a first electrode is electrically connected to any one electrode from among the source and drain electrodes of the light transistor, and which stores a conductance changing in accordance with a changed conductance of the light transistor;

wherein an on voltage that turns on the light transistor is applied to a gate electrode of the light transistor to perform a first sampling process in which the influence of incident light is reflected, wherein during the first sampling process, a voltage of a potentiation pulse is applied to a second electrode of the variable resistance memory device;

wherein after the first sampling process, an off voltage that turns off the light transistor is applied to a gate electrode of the light transistor, and a second sampling process is performed in which the influence of incident light is reduced or blocked, and wherein during the second sampling process, a voltage of a depression pulse is applied to the second electrode of the variable resistance memory device.

2. The device of claim 1, wherein after applying the voltage of a potentiation pulse to a second electrode of the variable resistance memory device, the voltage of a depression pulse is applied to store variable conductance reflecting the optical properties.

3. The device of claim 1, wherein a conductance of the variable resistance memory device is changed to gradually increase while reflecting the optical properties as the potentiation pulse is applied in the first sampling process.

4. The device of claim 1, wherein after the first sampling process, a reading voltage of a reading mode that derives information about variable conductance stored in the variable resistance memory device according to the first sampling process is applied to the second electrode of the variable resistance memory device.

5. The device of claim 1, wherein a conductance of the variable resistance memory device is changed to gradually decrease while reflecting the optical properties as the depression pulse is applied in the second sampling process.

6. The device of claim 5, wherein after the second sampling process, a reading voltage of a reading mode that derives information about variable conductance stored in the variable resistance memory device according to the second sampling process is applied to the second electrode of the variable resistance memory element.

7. The device of claim 5, wherein after the second sampling process, a resetting voltage for resetting the light transistor is applied to a gate electrode of the light transistor.

8. The device of claim 2, wherein when the incident light has optical properties with different color temperatures even if the illuminance is the same, or has optical properties that have different illuminances even if the color temperature is the same, a conductance of the variable resistance memory device, which changes depending on the application of the voltage, changes in different patterns.

9. The device of claim 2, wherein each variable conductance of the variable resistance memory device for each incident light of red light, green light and blue light has a different start conductance value and end conductance value, and a different variation between the start conductance and the end conductance according to the application of the voltage of the potentiation pulse.

10. The device of claim 1, wherein the variable resistance memory device comprises any one of a memristor, Resistive Random Access Memory (RRAM), Phase-change Random Access Memory (PcRAM), Magnetic Random Access Memory (MRAM), Ferroelectric Random Access Memory (FeRAM) and Conductive Bridging Random Access Memory (CBRAM).

11. A device, comprising:

a light transistor in which a conductance between a source electrode and a drain electrode changes in accordance with optical properties of color temperature and illumination of incident light; and a memristor device of two terminals which is respectively provided with a first electrode that is electrically connected to any one electrode of the source and drain electrodes of the light transistor, a resistance change layer that is provided on the first electrode and in which a resistance change occurs in accordance with an applied voltage between the two electrodes, and a second electrode that is provided on the resistance change layer and to which the voltage of a depression pulse is applied after the voltage of a potentiation pulse is applied;

wherein a voltage that turns on the light transistor is applied to a gate electrode of the light transistor to perform a first sampling process in which the influence of incident light is reflected, and wherein during the first sampling process, a voltage of a potentiation pulse is applied to a second electrode of the variable resistance memory device;

wherein after the first sampling process, a voltage that turns off the light transistor is applied to a gate electrode of the light transistor, and a second sampling process is performed in which the influence of incident light is reduced or blocked, and wherein during the second sampling process, the voltage of a depression pulse is applied to the second electrode of the variable resistance memory device.

12. The device of claim 11, wherein the resistance change layer is composed of an oxide material, and wherein the memristor device has a conductance that changes in accordance with the movement of oxygen charges according to the voltage applied to the second electrode.

13. The device of claim 11, wherein a channel layer of the light transistor and a resistance change layer of the memristor are composed of the same oxide material.

14. The device of claim 11, wherein the resistance change layer is composed of a metal-oxide material with the highest electromagnetic sensitivity to blue light among red light, green light and blue light.

15. The device of claim 11, wherein when the voltage of a potentiation pulse is applied, a variable conductance of the resistance change has the largest start and end conductance values or the largest variation between the start conductance and end conductance layer when blue light is the incident light, compared to when red light and green light are the incident light.

16. A system, comprising:

a device for changing conductance in accordance with the optical properties of color temperature and illuminance of incident light and storing a changed conductance;

a machine learning model which is pre-trained to output result information related to the optical properties of incident light, circadian illuminance or circadian rhythm from input information about variable conductance reflecting the optical properties of the incident light; and a controller for controlling to input the input information about variable conductance stored in the device into the machine learning model and output the result information;

a light transistor in which a conductance between a source electrode and a drain electrode changes in accordance with optical properties of color temperature and illumination of incident light; and a memristor device of two terminals which is respectively provided with a first electrode that is electrically connected to any one electrode of the source and drain electrodes of the light transistor, a resistance change layer that is provided on the first electrode and in which a resistance change occurs in accordance with the applied voltage between the two electrodes, and a second electrode that is provided on the resistance change layer and to which a voltage of a depression pulse is applied after the voltage of a potentiation pulse is applied;

wherein an on voltage that turns on the light transistor is applied to a gate electrode of the light transistor to perform a first sampling process in which the influence of incident light is reflected, and wherein during the first sampling process, a voltage of a potentiation pulse is applied to a second electrode of the variable resistance memory device;

wherein after the first sampling process, an off voltage that turns off the light transistor is applied to a gate electrode of the light transistor, and a second sampling process is performed in which the influence of incident light is reduced or blocked, and wherein during the second sampling process, a voltage of a depression pulse is applied to the second electrode of the variable resistance memory device.

17. The system of claim 16, wherein the device comprises:

a light transistor in which a conductance between a source electrode and a drain electrode changes in accordance with optical properties of color temperature and illumination of incident light; and a variable resistance memory device in which a first electrode is connected to any one electrode from among the source and drain electrodes of the light transistor, and which stores a conductance changing in accordance with a changed conductance of the light transistor.

18. The system of claim 17, wherein when the voltage of a potentiation pulse is applied, the variable resistance memory device stores information about a first variable conductance, and then stores information about a second variable conductance when a voltage of a depression pulse is applied thereafter, and wherein the controller inputs input information comprising information about the first variable conductance and second variable conductance into the machine learning model.

* * * * *